US012356817B2

(12) United States Patent
Kim et al.

(10) Patent No.: US 12,356,817 B2
(45) Date of Patent: Jul. 8, 2025

(54) DISPLAY DEVICE HAVING FIRST AND SECOND DISPLAY AREAS

(71) Applicant: SAMSUNG DISPLAY CO., LTD., Yongin-si (KR)

(72) Inventors: Sunghwan Kim, Yongin-si (KR); Jinwoo Park, Yongin-si (KR); Junghoon Shim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/470,212

(22) Filed: Sep. 19, 2023

(65) Prior Publication Data

US 2024/0008332 A1     Jan. 4, 2024

Related U.S. Application Data

(63) Continuation of application No. 17/935,800, filed on Sep. 27, 2022, now Pat. No. 11,765,952, which is a
(Continued)

(30) Foreign Application Priority Data

Apr. 22, 2020  (KR) .................. 10-2020-0048860

(51) Int. Cl.
*H10K 59/131*   (2023.01)
*G09G 3/3233*   (2016.01)
(Continued)

(52) U.S. Cl.
CPC ......... *H10K 59/131* (2023.02); *G09G 3/3233* (2013.01); *G09G 2300/0439* (2013.01);
(Continued)

(58) Field of Classification Search
CPC .... H10K 59/131; H10K 59/122; H10K 59/35; H10K 59/124; H10K 50/822;
(Continued)

(56) References Cited

U.S. PATENT DOCUMENTS

| | | |
|---|---|---|
| 8,982,017 B2 | 3/2015 | Lee et al. |
| 9,978,306 B2 * | 5/2018 | Lee ..................... G09G 3/3225 |
| 10,186,567 B2 | 1/2019 | Jeong et al. |
| 10,651,264 B2 | 5/2020 | An et al. |
| 11,073,712 B2 | 7/2021 | Yeke Yazdandoost et al. |

(Continued)

FOREIGN PATENT DOCUMENTS

| | | |
|---|---|---|
| KR | 10-2013-0026338 A | 3/2013 |
| KR | 10-2015-0078767 A | 7/2015 |

(Continued)

*Primary Examiner* — Kwang-Su Yang
(74) *Attorney, Agent, or Firm* — Womble Bond Dickinson (US) LLP

(57) ABSTRACT

A display device includes: a first display area comprising main sub-pixels; a second display area comprising pixel groups spaced apart from each other and a transmission portion between the pixel groups, the second display area having a different resolution from that of the first display area; and extension lines between two pixel groups adjacent to each other in a first direction among the pixel groups and extending in the first direction, wherein each of the pixel groups comprises a plurality of auxiliary sub-pixels and a plurality of horizontal lines electrically connected to the plurality of auxiliary sub-pixels and extending in the first direction, and the extension lines are electrically connected to the horizontal lines included in each of the two pixel groups, and a number of the extension lines is less than a number of the horizontal lines.

20 Claims, 30 Drawing Sheets

Related U.S. Application Data continuation of application No. 17/226,502, filed on Apr. 9, 2021, now Pat. No. 11,456,350.

(51) Int. Cl.
| | |
|---|---|
| *H04N 23/57* | (2023.01) |
| *H10K 50/822* | (2023.01) |
| *H10K 50/844* | (2023.01) |
| *H10K 59/122* | (2023.01) |
| *H10K 59/124* | (2023.01) |
| *H10K 59/35* | (2023.01) |

(52) U.S. Cl.
CPC ............ *G09G 2300/0809* (2013.01); *G09G 2340/0407* (2013.01); *H04N 23/57* (2023.01); *H10K 50/822* (2023.02); *H10K 50/844* (2023.02); *H10K 59/122* (2023.02); *H10K 59/124* (2023.02); *H10K 59/35* (2023.02)

(58) Field of Classification Search
CPC ............ H10K 50/844; G09G 3/3233; G09G 2300/0439; G09G 2300/0809; G09G 2340/0407; H04N 23/57
See application file for complete search history.

(56) References Cited

U.S. PATENT DOCUMENTS

| | | |
|---|---|---|
| 11,217,639 B2 | 1/2022 | Baek et al. |
| 2017/0255324 A1* | 9/2017 | Oka .............. G06F 3/0412 |
| 2018/0006105 A1 | 1/2018 | Kim et al. |
| 2018/0089485 A1 | 3/2018 | Bok |
| 2018/0175135 A1 | 6/2018 | Lim et al. |
| 2018/0197484 A1 | 7/2018 | Moon et al. |
| 2019/0130822 A1 | 5/2019 | Jung et al. |
| 2020/0133040 A1 | 4/2020 | Bang et al. |
| 2021/0065625 A1 | 3/2021 | Wang et al. |
| 2022/0020321 A1 | 1/2022 | Jung et al. |
| 2022/0045299 A1* | 2/2022 | Liu .............. H10K 59/353 |

FOREIGN PATENT DOCUMENTS

| | | |
|---|---|---|
| KR | 10-2016-0046152 A | 4/2016 |
| KR | 10-2017-0113066 A | 10/2017 |
| KR | 10-2018-0004382 A | 1/2018 |
| KR | 10-1859105 B1 | 5/2018 |
| KR | 10-2018-0079512 A | 7/2018 |
| KR | 10-2019-0062988 A | 6/2019 |
| KR | 10-2020-0036137 A | 4/2020 |
| KR | 10-2020-0050059 A | 5/2020 |

* cited by examiner

DISPLAY DEVICE HAVING FIRST AND SECOND DISPLAY AREAS

CROSS-REFERENCE TO RELATED APPLICATIONS

This application is a continuation of U.S. patent application Ser. No. 17/935,800, filed Sep. 27, 2022, now U.S. Pat. No. 11,765,952, which is a continuation of U.S. patent application Ser. No. 17/226,502, filed Apr. 9, 2021, now U.S. Pat. No. 11,456,350, which claims priority to and the benefit of Korean Patent Application No. 10-2020-0048860, filed Apr. 22, 2020, the entire content of all of which is incorporated herein by reference.

BACKGROUND

1. Field

Aspects of one or more example embodiments relate to a display device.

2. Description of the Related Art

As displays for visually expressing various electrical signal information have rapidly developed, various flat panel display devices having relatively excellent characteristics such as thin profiles, small weight, and low power consumption have been introduced. In addition, recently, display devices without a physical button or the like in the front part thereof and an expanded image display area have been introduced.

The above information disclosed in this Background section is only for enhancement of understanding of the background and therefore the information discussed in this Background section does not necessarily constitute prior art.

SUMMARY

Aspects of one or more example embodiments include a display device capable of displaying images even in areas where electronic elements such as cameras and sensors are located.

Additional aspects will be set forth in part in the description which follows and, in part, will be apparent from the description, or may be learned by practice of the presented example embodiments of the disclosure.

According to one or more example embodiments, a display device includes a first display area including main sub-pixels, a second display area including pixel groups apart from each other and a transmission portion between the pixel groups, the second display area having a different resolution from that of the first display area, and extension lines arranged between two pixel groups adjacent to each other in a first direction among the pixel groups and extending in the first direction, wherein each of the pixel groups includes a plurality of auxiliary sub-pixels and a plurality of horizontal lines electrically connected to the plurality of auxiliary sub-pixels and extending in the first direction, the extension lines are electrically connected to the horizontal lines included in each of the two pixel groups, and the number of the extension lines may be less than the number of the horizontal lines.

According to some example embodiments, two adjacent extension lines from among the extension lines may be located on different layers.

According to some example embodiments, on a plane, the width of an area in which the extension lines are arranged in a second direction perpendicular to the first direction may be less than the width of an area in which the horizontal lines are arranged in the second direction.

According to some example embodiments, each of the plurality of auxiliary sub-pixels includes a pixel circuit and a display element electrically connected to the pixel circuit, the pixel circuit includes a driving thin-film transistor that supplies a driving current to the display element, a first initialization thin-film transistor that initializes the voltage of a driving gate electrode of the driving thin-film transistor, and a second initialization thin film that initializes a pixel electrode of the display element, and the horizontal lines include a first initialization voltage line configured to transmit an initialization voltage to the first initialization thin-film transistor and a second initialization voltage line configured to transmit the initialization voltage to the second initialization thin-film transistor, wherein the first initialization voltage line and the second initialization voltage line may be electrically connected to each other by a first connection line.

According to some example embodiments, the pixel circuit further includes a switching thin-film transistor configured to transmit a data signal to a driving source electrode of the driving thin-film transistor, and the horizontal lines further include a first scan line for transmitting a previous scan signal to the first initialization thin-film transistor, a second scan line electrically connected to a switching gate electrode of the switching thin-film transistor, and a third scan line electrically connected to a second initialization gate electrode of the second initialization thin-film transistor, wherein the second scan line and the third scan line are electrically connected to each other by a second connection line, and the same scan signal may be applied thereto.

According to some example embodiments, at least one of the first connection line or the second connection line may be located on a different layer from that of the horizontal lines.

According to some example embodiments, each of the pixel groups includes a first row and a second row in which the plurality of auxiliary sub-pixels are arranged in the first direction, wherein a first auxiliary sub-pixel included in the first row and a second auxiliary sub-pixel included in the second row are arranged adjacent to each other in a second direction perpendicular to the first direction, and the second initialization voltage line and the third scan line may be shared by the first auxiliary sub-pixel and the second auxiliary sub-pixel.

According to some example embodiments, the second initialization voltage line and the third scan line may be electrically connected to a first initialization thin-film transistor of the second auxiliary sub-pixel.

According to some example embodiments, the horizontal lines may further include a third initialization voltage line that crosses the second row in the first direction and along which an initialization voltage is applied to a second initialization thin-film transistor of the second auxiliary sub-pixel, wherein the third initialization voltage line may be electrically connected to the first connection line.

According to some example embodiments, the horizontal lines may further include a first emission control line crossing the first row in the first direction, and a second emission control line crossing the second row in the first direction, wherein the first emission control line and the second emission control line are electrically connected to each other so that the same emission control signal may be transmitted to the first auxiliary sub-pixel and the second auxiliary sub-pixel.

According to some example embodiments, the second display area may be surrounded by the first display area.

According to one or more example embodiments, a display device includes a display panel having a first display area and a second display area having different resolutions from each other, and an electronic element arranged to correspond to the second display area of the display panel, wherein the display panel includes a substrate, main sub-pixels arranged on the substrate in the first display area, pixel groups arranged on the substrate and apart from each other in the second display area, and extension lines arranged between two pixel groups adjacent to each other in a first direction among the pixel groups and extending in the first direction, wherein each of the pixel groups includes a plurality of auxiliary sub-pixels and a plurality of horizontal lines electrically connected to the plurality of auxiliary sub-pixels and extending in the first direction, and the extension lines are electrically connected to the horizontal lines included in each of the two pixel groups. On a plane, the width of an area in which the extension lines are arranged in a second direction perpendicular to the first direction may be less than the width of an area in which the horizontal lines are arranged in the second direction.

According to some example embodiments, two adjacent extension lines from among the extension lines may be located on different layers.

According to some example embodiments, each of the plurality of auxiliary sub-pixels includes a pixel circuit and a display element electrically connected to the pixel circuit, the pixel circuit includes a driving thin-film transistor that supplies a driving current to the display element, a first initialization thin-film transistor that initializes the voltage of a driving gate electrode of the driving thin-film transistor, and a second initialization thin film that initializes a pixel electrode of the display element, and the horizontal lines include a first initialization voltage line for transmitting an initialization voltage to the first initialization thin-film transistor and a second initialization voltage line for transmitting the initialization voltage to the second initialization thin-film transistor, wherein the first initialization voltage line and the second initialization voltage line may be electrically connected to each other by a first connection line.

According to some example embodiments, the pixel circuit further includes a switching thin-film transistor configured to transmit a data signal to a driving source electrode of the driving thin-film transistor, and the horizontal lines further include a first scan line for transmitting a previous scan signal to the first initialization thin-film transistor, a second scan line electrically connected to a switching gate electrode of the switching thin-film transistor, and a third scan line electrically connected to a second initialization gate electrode of the second initialization thin-film transistor, wherein the second scan line and the third scan line are electrically connected to each other by a second connection line, and the same scan signal may be applied thereto.

According to some example embodiments, each of the pixel groups includes a first row and a second row in which the plurality of auxiliary sub-pixels are arranged in the first direction, wherein a first auxiliary sub-pixel included in the first row and a second auxiliary sub-pixel included in the second row are arranged adjacent to each other in a second direction perpendicular to the first direction, and the second initialization voltage line and the third scan line may be electrically connected to the first initialization thin-film transistor of the second auxiliary sub-pixel.

According to some example embodiments, the horizontal lines may further include a third initialization voltage line that crosses the second row in the first direction and along which an initialization voltage is applied to a second initialization thin-film transistor of the second auxiliary sub-pixel, wherein the third initialization voltage line may be electrically connected to the first connection line.

According to some example embodiments, the horizontal lines may further include a first emission control line crossing the first row in the first direction, and a second emission control line crossing the second row in the first direction, wherein the first emission control line and the second emission control line are electrically connected to each other so that the same emission control signal may be transmitted to the first auxiliary sub-pixel and the second auxiliary sub-pixel.

According to some example embodiments, the number of the extension lines may be less than the number of the horizontal lines.

According to some example embodiments, the electronic element may include an imaging device.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
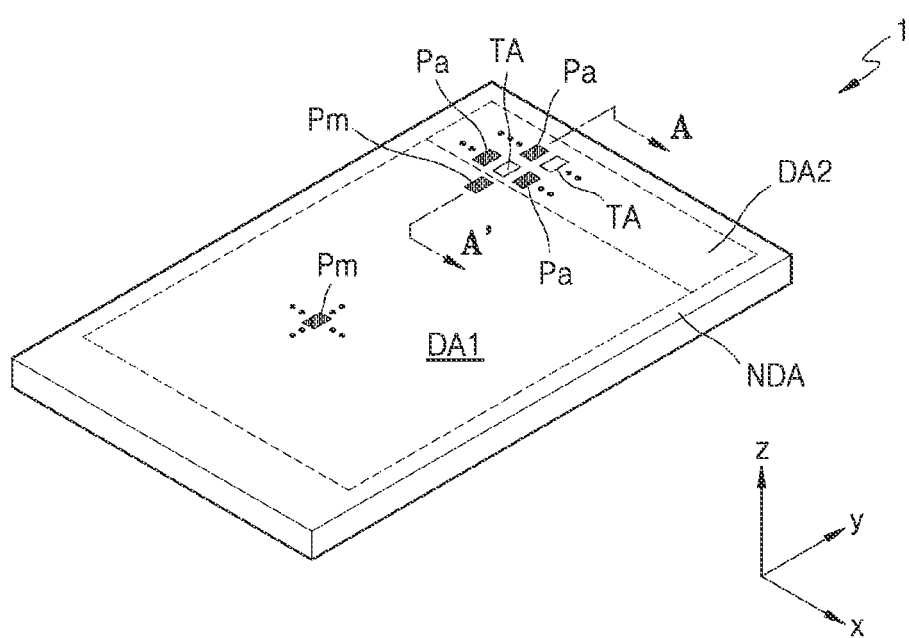
FIG. 1 is a perspective view of a display device according to some example embodiments.

Reference will now be made in more detail to aspects of some example embodiments, which are illustrated in the accompanying drawings, wherein like reference numerals refer to like elements throughout. In this regard, the embodiments according to the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, example embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. may be used herein to describe various elements, these elements should not be limited by these terms.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of components in the drawings are arbitrarily illustrated for convenience of explanation, the following embodiments are not limited thereto.

Hereinafter, embodiments will be described in more detail with reference to the accompanying drawings. The same reference numerals are used to denote the same elements.

FIG. 1 is a perspective view of a display device 1 according to some example embodiments.

Referring to FIG. 1, the display device 1 includes a first display area DA1 for implementing an image and a non-display area NDA for not implementing an image. The display device 1 may provide a main image using light emitted from a plurality of main sub-pixels Pm arranged in the first display area DA1. In the specification, a sub-pixel is an area in which one color, such as red, green, blue, and white, may be emitted, and refers to a minimum unit constituting an image.

The display device 1 includes a second display area DA2. The second display area DA2 may be an area in which components such as sensors and/or cameras using visible light, infrared light, and sound are arranged. The second display area DA2 may include a transmission portion TA through which light and/or sound that are output to the outside from the component or traveling from the outside toward the component may pass. According to some example embodiments, when light is transmitted through the second display area DA2, light transmittance may be about 30% or more, about 50% or more, about 75% or more, about 80% or more, about 85% or more, or about 90% or more.

According to some example embodiments, a plurality of auxiliary sub-pixels Pa may be arranged in the second display area DA2, and a certain image may be provided using light emitted from the plurality of auxiliary sub-pixels Pa. The image provided by the second display area DA2 may have a lower resolution than that of the image provided by the first display area DA1 as a sub-image. That is, because the second display area DA2 has the transmission portion TA through which light and/or sound may pass, the number of auxiliary sub-pixels Pa that may be arranged per unit area may be less than the number of main sub-pixels Pm arranged per unit area in the first display area DA1.

The second display area DA2 may be arranged on one side of the first display area DA1. According to some example embodiments, FIG. 1 shows that the second display area DA2 is arranged above the first display area DA1 and the second display area DA2 is arranged between the non-display area NDA and the first display area DA1. However, embodiments according to the present disclosure are not limited thereto. For example, a shape of the first display area DA1 may be a circle, an ellipse, or a polygon such as a triangle or a pentagon. The second display area DA2 may be arranged inside the first display area DA1 and may be surrounded by the first display area DA1.

In addition, as the display device 1 according to some example embodiments, an organic light-emitting display device will be described as an example, but a display device in embodiments according to the present disclosure is not limited thereto. According to some example embodiments, the display device 1 according to some example embodiments may be various types of display devices such as an inorganic light-emitting (EL) display apparatus and a quantum dot EL display apparatus.

Figure 2:
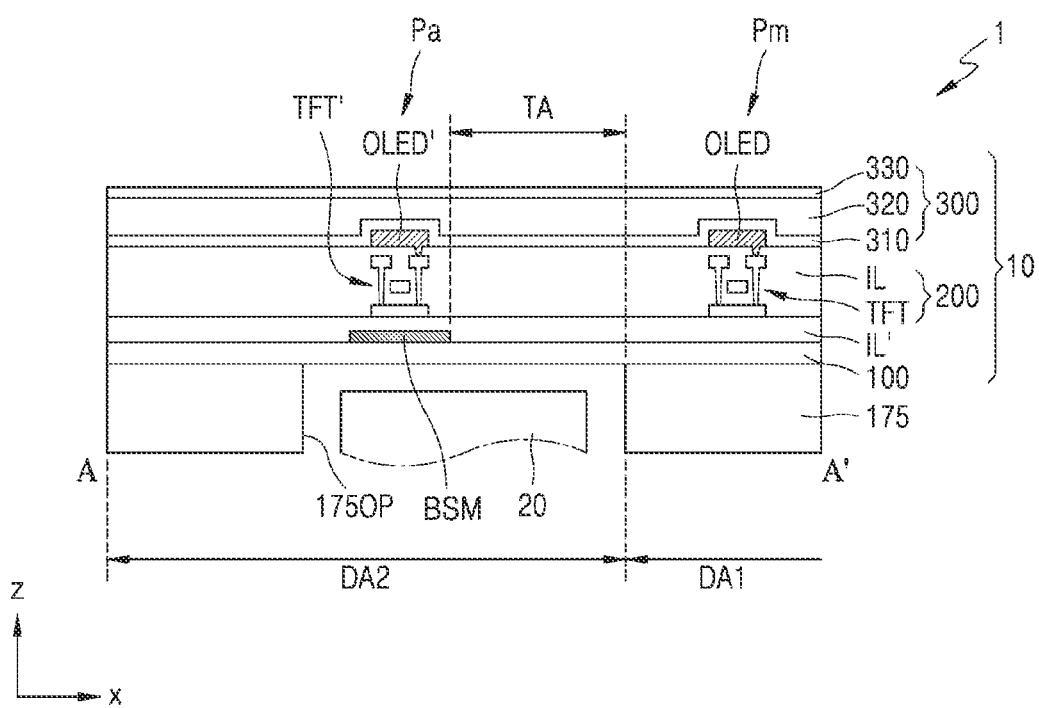
FIG. 2 is a cross-sectional view of an example of a cross-section of the display device taken along a line A-A' of FIG. 1 according to some example embodiments.

FIG. 2 is a cross-sectional view of an example of a cross-section of the display device 1 taken along a line A-A' of FIG. 1.

Referring to FIG. 2, the display device 1 may include a display panel 10 including a display element and a component 20 corresponding to the second display area DA2.

The display panel 10 may include a substrate 100, a display element layer 200 above the substrate 100, and an encapsulation layer 300 as a sealing member for sealing the display element layer 200. In addition, the display panel 10 may further include a lower protective film 175 below the substrate 100.

The substrate 100 may include glass or a polymer resin. The polymer resin may include polyethersulfone, polyacrylate, polyetherimide, polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 including the polymer resin may be flexible, rollable, or bendable. The substrate 100 may have a multilayer structure including a layer including the above-described polymer resin and an inorganic layer.

The display element layer 200 may include a circuit layer including thin-film transistors TFT and TFT', an organic light-emitting diode OLED as a display element, and insulating layers IL and IL' therebetween.

A main sub-pixel Pm including the first thin-film transistor TFT and the organic light-emitting diode OLED connected thereto may be arranged in the first display area DA1, and an auxiliary sub-pixel Pa including the second thin-film transistor TFT' and the organic light-emitting diode OLED connected thereto may be arranged in the second display area DA2.

Further, the second display area DA2 may be provided with the transmission portion TA not including any display element. Light or signals emitted from the component 20 may be transmitted to the outside through the transmission portion TA, and the external light or signal may be received to the component 20 through the transmission portion TA.

The component 20 may be located in the second display area DA2. The component 20 may be an electronic element that uses (e.g., emits or receives) light or sound. For example, the component 20 may include an imaging device as a camera using infrared light or visible light. In addition, the component 20 may include a sensor that receives and uses light, such as an infrared sensor, a sensor that outputs and detects light and sound to measure the distance or recognize fingerprints, a speaker that outputs sound, and the like.

When the component 20 is an electronic element using light, light in various wavelength bands such as visible light, infrared light, and ultraviolet light may be used. The number of components 20 arranged in the second display area DA2 may be plural. For example, as the component 20, a light-emitting element and a light receiving element may be provided together in one second display area DA2. Alternatively, a light-emitting unit and a light receiving unit may be both provided in one component 20.

A lower electrode layer BSM may be arranged in the second display area DA2. The lower electrode layer BSM may be arranged to correspond to a lower portion of the second thin-film transistor TFT'. The lower electrode layer BSM may block external light from reaching the auxiliary sub-pixel Pa including the second thin-film transistor TFT'. For example, the lower electrode layer BSM may block light emitted from the component 20 from reaching the auxiliary sub-pixel Pa.

In some example embodiments, a constant voltage or a signal may be applied to the lower electrode layer BSM to prevent or reduce damage to a pixel circuit due to electrostatic discharge.

The encapsulation layer 300 may include at least one inorganic encapsulation layer and at least one organic encapsulation layer. In this regard, FIG. 2 shows first and second inorganic encapsulation layers 310 and 330 and an organic encapsulation layer 320 therebetween.

The first and second inorganic encapsulation layers 310 and 330 may include one or more inorganic insulating materials such as aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and/or polyethylene.

The lower protective film 175 may be attached under the substrate 100 to support and protect the substrate 100. The lower protective film 175 may have an opening 175OP corresponding to the second display area DA2. Light transmittance of the second display area DA2 may be improved by providing the opening 175OP in the lower protective film 175. The lower protective film 175 may be formed of PET or PI.

An area of the second display area DA2 may be greater than an area where the component 20 is arranged. Accordingly, an area of the opening 175OP provided in the lower protective film 175 may not coincide with the area of the second display area DA2. For example, the area of the opening 175OP may be less than the area of the second display area DA2. As another example, the opening 175OP may not be formed in the lower protective film 175, and the component 20 may be located on the lower protective film 175 to prevent or reduce instances of the substrate 100 being damaged by the component 20.

Also, a plurality of components 20 may be arranged in the second display area DA2. The plurality of components 20 may have different functions from each other. For example, one of the plurality of components 20 may be a camera, and the other may be an infrared sensor.

According to some example embodiments, on the display panel 10, components such as an input sensing member for sensing a touch input, an antireflection member including a polarizer and a retarder or a color filter and a black matrix, and a transparent window may further be arranged.

Although the encapsulation layer 300 is used as a sealing member for sealing the display element layer 200 according to some example embodiments, embodiments according to the present disclosure are not limited thereto. For example, as a member for sealing the display element layer 200, a sealing substrate which is bonded to the substrate 100 by sealant or frit may be used.

Figure 3:
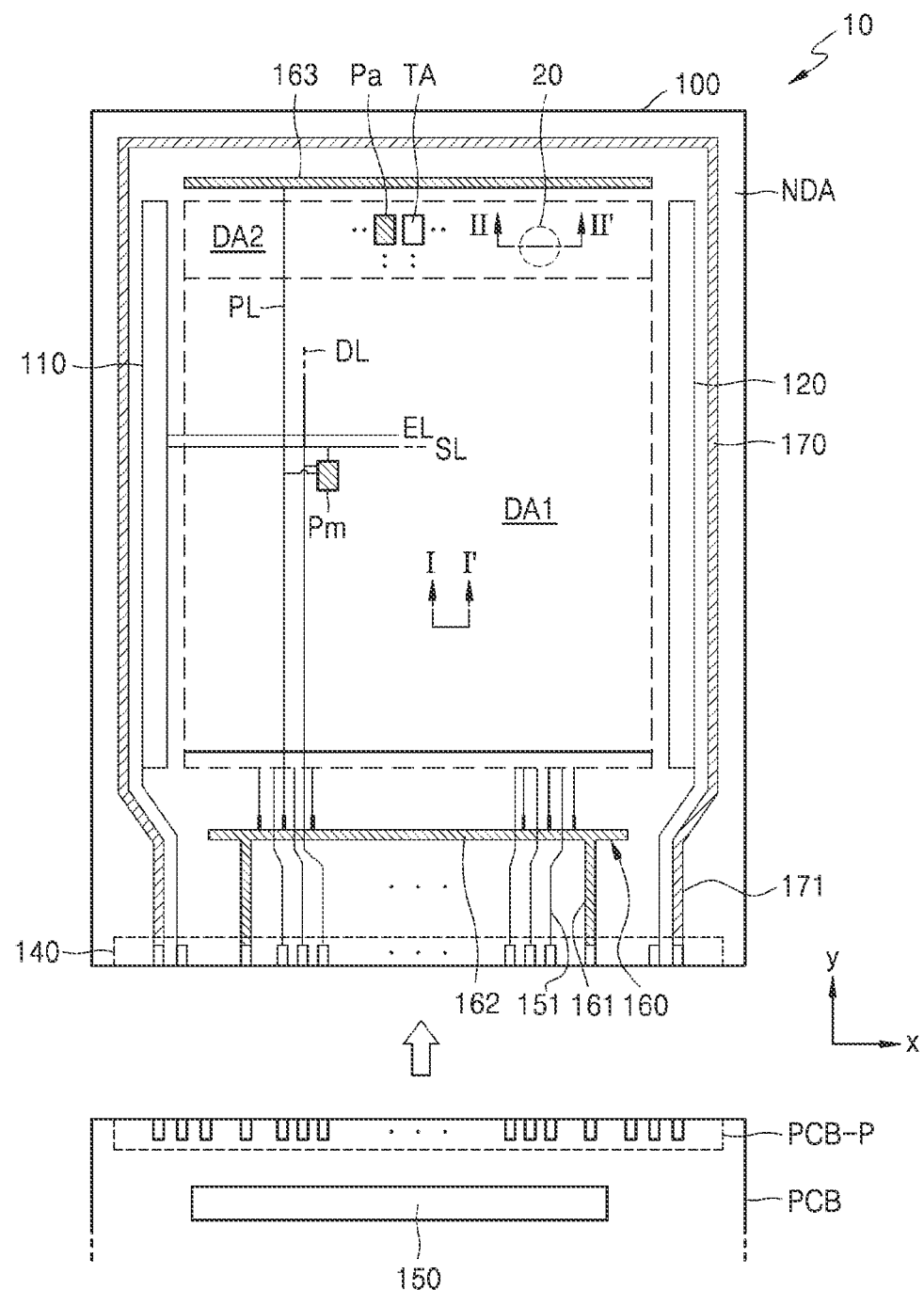
FIG. 3 is a plan view of an example of a display panel of the display device of FIG. 1 according to some example embodiments.
Figure 4:
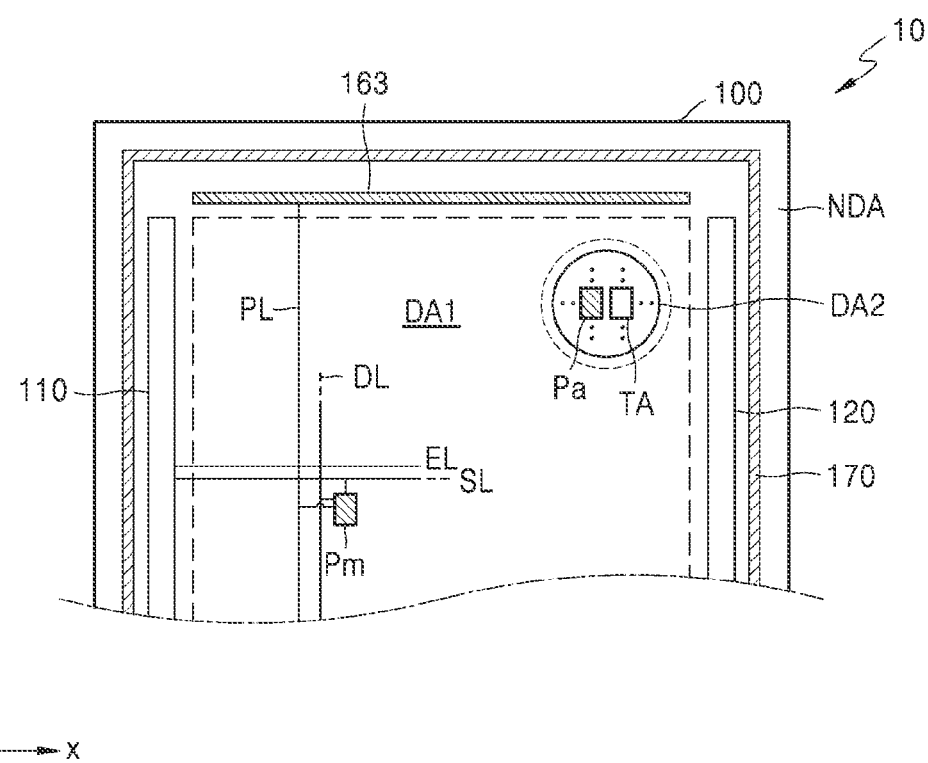
FIG. 4 is a plan view of a modification of the display panel of FIG. 3 according to some example embodiments.

FIG. 3 is a plan view of an example of the display panel 10 of the display device 1 of FIG. 1, and FIG. 4 is a plan view of a modification of the display panel 10 of FIG. 3.

Referring first to FIG. 3, the display panel 10 includes a plurality of main sub-pixels Pm arranged in the first display area DA1. Each of the main sub-pixels Pm may be implemented with a display element such as an organic light-emitting diode. Each of the main sub-pixels Pm may emit light of any one color, for example, red, green, blue, or white, through the organic light-emitting diode. The first display area DA1 may be covered with the sealing member described above with reference to FIG. 2 and protected from external air or moisture.

The second display area DA2 may be arranged on one side of the first display area DA1, and the plurality of auxiliary sub-pixels Pa may be arranged in the second display area DA2. Each of the auxiliary sub-pixels Pa may be implemented with a display element such as an organic light-emitting diode. Each of the main sub-pixels Pm may emit light of any one color, for example, red, green, blue, or white, through the organic light-emitting diode. Meanwhile, the transmission portion TA between the auxiliary sub-pixels Pa may be arranged in the second display area DA2. At least one component 20 may be arranged corresponding to a lower portion of the second display area DA2 of the display panel 10.

According to some example embodiments, one main sub-pixel Pm and one auxiliary sub-pixel Pa may be respectively driven by pixel circuits having the same configuration. However, embodiments according to the present disclosure are not limited thereto. Additionally, the pixel circuit driving the main sub-pixel Pm may be different from the pixel circuit driving the auxiliary sub-pixel Pa. Meanwhile, because the second display area DA2 includes the transmission portion TA, a resolution of the second display area DA2 may be less than that of the first display area DA1.

The pixel circuits driving the sub-pixels Pm and Pa may be electrically connected to external circuits arranged in the non-display area NDA, respectively. The non-display area NDA may include a first scan driving circuit 110, a second scan driving circuit 120, a terminal 140, a data driving circuit 150, a first power supply line 160, and a second power supply line 170.

The first scan driving circuit 110 may supply a scan signal to each pixel circuit through a scan line SL. The first scan driving circuit 110 may provide an emission control signal to each pixel circuit through an emission control line EL. The second scan driving circuit 120 may be arranged in parallel with the first scan driving circuit 110 with the first display area DA1 therebetween. Some of the sub-pixels Pm and Pa arranged in the first display area DA1 may be electrically connected to the first scan driving circuit 110 and the remaining may be connected to the second scan driving circuit 120. According to some example embodiments, the second scan driving circuit 120 may be omitted.

The terminal 140 may be on one side of the substrate 100. The terminal 140 may be exposed without being covered by the insulating layer and electrically connected to a printed circuit board PCB. A terminal PCB-P of the printed circuit board PCB may be electrically connected to the terminal 140 of the display panel 10. The printed circuit board PCB transmits a signal or power of a controller to the display panel 10. Control signals generated by a controller may be transmitted to the first and second scan driving circuits 110 and 120 through the printed circuit board PCB, respectively. The controller may provide first and second power voltages ELVDD and ELVSS (see FIGS. 4A and 4B to be described in more detail below) to the first and second power supply lines 160 and 170 through first and second connection lines 161 and 171, respectively. The first power voltage ELVDD may be provided to a pixel circuit driving each of the sub-pixels Pm and Pa through a driving voltage line PL connected to the first power supply line 160, and the second power voltage ELVSS may be provided to an opposite electrode of the organic light-emitting diode OLED connected to the second power supply line 170.

The data driving circuit 150 is electrically connected to a data line DL. A data signal of the data driving circuit 150 may be provided to the pixel circuit driving each of the sub-pixels Pm and Pa through a connection line 151 connected to the terminal 140 and the data line DL connected to the connection line 151. FIG. 3 shows that the data driving circuit 150 is arranged on the printed circuit board PCB. However, according to some example embodiments, the data driving circuit 150 may be on the substrate 100. For example, the data driving circuit 150 may be between the terminal 140 and the first power supply line 160.

The first power supply line 160 may include a first sub-line 162 and a second sub-line 163 extending in parallel with each other in an x direction with the first display area DA1 therebetween. The second power supply line 170 may partly surround the first display area DA1 in a loop shape with one side open.

Meanwhile, FIG. 3 shows that the second display area DA2 is arranged on one side of the first display area DA1, but embodiments according to the present disclosure are not limited thereto. For example, as shown in FIG. 4, the second display area DA2 may be provided as an area corresponding to a component under the second display area DA2. In this case, the second display area DA2 may be arranged inside the first display area DA1 to be surrounded by the first display area DA1.

Figure 5:
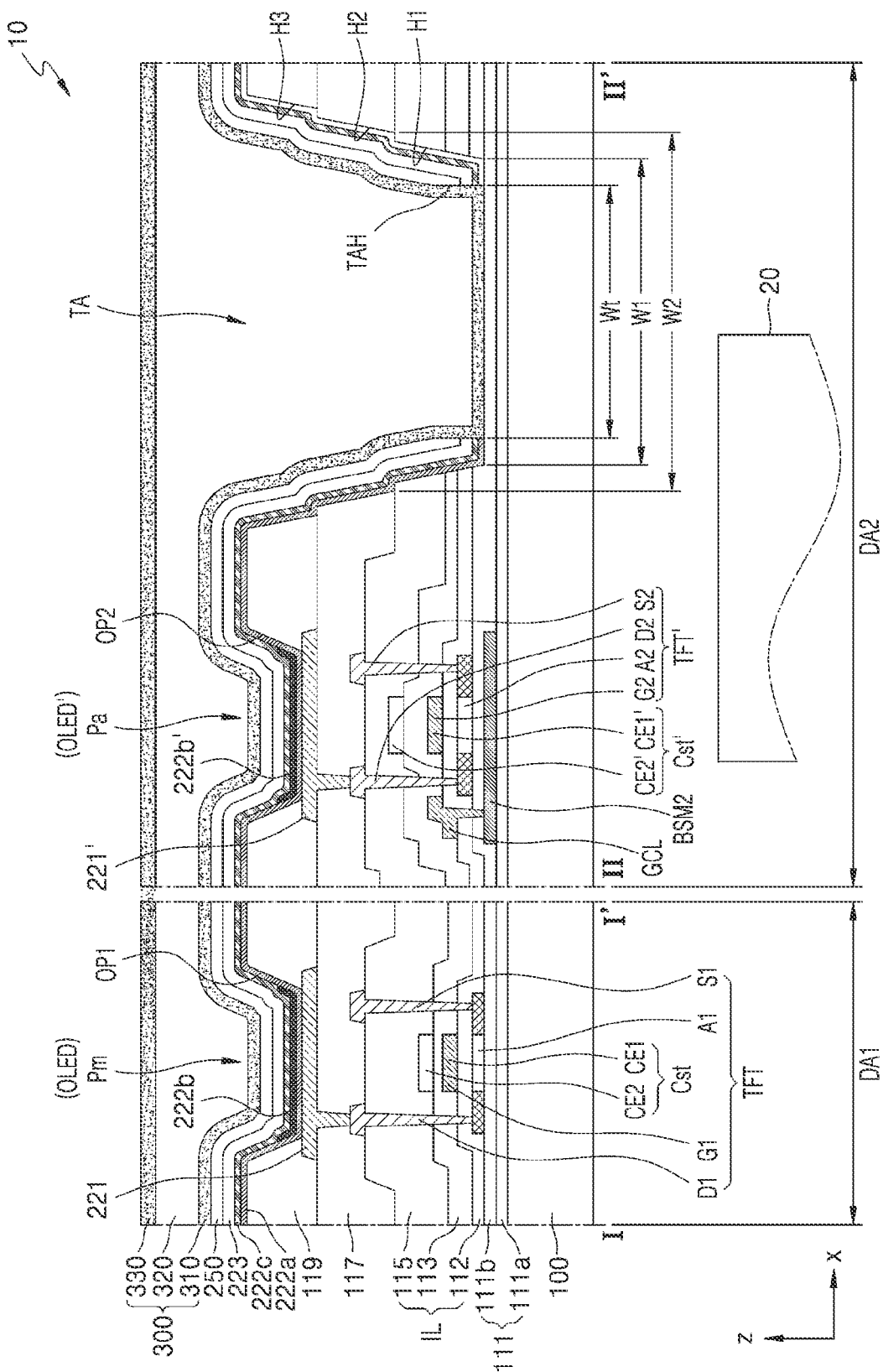
FIG. 5 is a cross-sectional view of an example of a cross-section of the display panel taken along the lines I-I' and II-II' of FIG. 3 according to some example embodiments.

FIG. 5 is a cross-sectional view of an example of a cross-section of the display panel 10 taken along the lines I-I' and II-II' of FIG. 3.

Referring to FIG. 5, a buffer layer 111 may be located on the substrate 100. The buffer layer 111 may reduce or block the penetration of foreign materials, moisture, or external air from a lower portion of the substrate 100 and may provide a flat surface on the substrate 100. The buffer layer 111 may include an inorganic material, such as an oxide or nitride, an organic material, or an organic-inorganic composite material, and may have a single layer structure or a multilayer structure including an inorganic material or an organic material. A barrier layer may be further included between the substrate 100 and the buffer layer 111 to block penetration of external air. In some embodiments, the buffer layer 111 may include silicon oxide ($SiO_2$) or silicon nitride ($SiN_x$). The buffer layer 111 may be provided such that a first buffer layer 111a and a second buffer layer 111b are stacked. Here, the first buffer layer 111a and the second buffer layer 111b may be made of different materials. For example, the first buffer layer 111a may contain silicon nitride, and the second buffer layer 111b may contain silicon oxide.

In the second display area DA2, the lower electrode layer BSM may be arranged between the first buffer layer 111a and the second buffer layer 111b. According to some example embodiments, the lower electrode layer BSM may be arranged between the substrate 100 and the first buffer layer 111a. The lower electrode layer BSM is arranged under the second thin-film transistor TFT' to prevent or reduce instances of characteristics of the second thin-film transistor TFT' being deteriorated by light emitted from the component 20 or the like.

In addition, the lower electrode layer BSM may be connected to a line GCL arranged on another layer through a contact hole. The lower electrode layer BSM may be provided with a constant voltage or a signal from the line GCL. For example, the lower electrode layer BSM may be provided with a driving voltage first power voltage ELVDD or a scan signal. The lower electrode layer BSM is provided with a constant voltage or a signal so that the probability of occurrence of electrostatic discharge may be remarkably reduced. The lower electrode layer BSM may include Al, Pt, Pd, Ag, Mg, Au, Ni, Nd, Ir, Cr, Li, Ca, Mo, Ti, W and/or Cu. The lower electrode layer BSM may be a single layer or multiple layers of the above-described material.

The first thin-film transistor TFT and the second thin-film transistor TFT' may be arranged on the buffer layer 111. The first thin-film transistor TFT includes a first semiconductor layer A1, a first gate electrode G1, a first source electrode S1, and a first drain electrode D1. The second thin-film transistor TFT' includes a second semiconductor layer A2, a second gate electrode G2, a second source electrode S2, and a second drain electrode D2. The first thin-film transistor TFT may be connected to a main organic light-emitting diode OLED of the first display area DA1 to drive the main organic light-emitting diode OLED. The second thin-film transistor TFT' may be connected to an auxiliary organic light-emitting diode OLED' of the second display area DA2 to drive the auxiliary organic light-emitting diode OLED'.

The first semiconductor layer A1 and the second semiconductor layer A2 are arranged on the buffer layer 111 and may include polysilicon. According to some example embodiments, the first semiconductor layer A1 and the second semiconductor layer A2 may include amorphous silicon. According to some example embodiments, the first semiconductor layer A1 and the second semiconductor layer A2 may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may include a channel area, and source and drain areas that are doped with impurities.

The first semiconductor layer A1 may overlap the lower electrode layer BSM with the second buffer layer 111b therebetween. According to some example embodiments, a width of the first semiconductor layer A1 may be less than a width of the lower electrode layer BSM. Therefore, when projected in a direction perpendicular to the substrate 100, the first semiconductor layer A1 may entirely overlap the lower electrode layer BSM.

A first gate insulating layer 112 may be provided to cover the first semiconductor layer A1 and the second semiconductor layer A2. The first gate insulating layer 112 may include an inorganic insulating material such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may be a single layer or multiple layers including the above-described inorganic insulating material.

The first gate electrode G1 and the second gate electrode G2 are arranged on the first gate insulating layer 112 so as to overlap the first semiconductor layer A1 and the second semiconductor layer A2, respectively. Each of the first gate electrode G1 and the second gate electrode G2 includes molybdenum (Mo), aluminum (Al), copper (Cu), or titanium (Ti) and may be formed as a single layer or multiple layers. For example, each of the first gate electrode G1 and the second gate electrode G2 may be a single layer of Mo.

A second gate insulating layer 113 may be provided to cover the first gate electrode G1 and the second gate electrode G2. The second gate insulating layer 113 may include an inorganic insulating material such as $SiO_2$, $SiN_x$, SiON, $Al_2O_3$, $TiO_2$, $Ta_2O_5$, $HfO_2$, or $ZnO_2$. The second gate insulating layer 113 may be a single layer or multiple layers including the above-described inorganic insulating material.

A first upper electrode CE2 of a main storage capacitor Cst and a second upper electrode CE2' of an auxiliary storage capacitor Cst' may be arranged on the second gate insulating layer 113.

In the first display area DA1, the first upper electrode CE2 may overlap the first gate electrode G1 placed therebelow. The first gate electrode G1 and the first upper electrode CE2 overlapping each other with the second gate insulating layer 113 therebetween may form the main storage capacitor Cst. The first gate electrode G1 may be a first lower electrode CE1 of the main storage capacitor Cst.

In the second display area DA2, the second upper electrode CE2' may overlap the second gate electrode G2 therebelow. The second gate electrode G2 and the second upper electrode CE2' overlapping each other with the second gate insulating layer 113 therebetween may form the auxiliary storage capacitor Cst'. The first gate electrode G1 may be a second lower electrode CE1' of the auxiliary storage capacitor Cst'.

The first upper electrode CE2 and the second upper electrode CE2' may include Al, Pt, Pd, Ag, Mg, Au, Ni, Nd, Ir, Cr, Li, Ca, Mo, Ti, W and/or Cu, and may be a single layer or multiple layers of the above-described material.

An interlayer insulating layer 115 may be formed to cover the second electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, or $ZnO_2$.

When the first gate insulating layer 112, the second gate insulating layer 113, and the interlayer insulating layer 115 are collectively referred to as an inorganic insulating layer IL, a structure in which the inorganic insulating layer IL is stacked on the substrate 100 may have transmittance of about 90% or more with respect to infrared wavelengths. For example, light having a wavelength of 900 nm to 1100 nm passing through the substrate 100 and the inorganic insulating layer IL may have transmittance of about 90%.

The source electrodes S1 and S2 and the drain electrodes D1 and D2 are arranged on the interlayer insulating layer 115. Each of the source electrodes S1 and S2 and the drain electrodes D1 and D2 may include a conductive material including Mo, Al, Cu, or Ti and may be formed as a single layer or multiple layers including the above materials. For example, each of the source electrodes S1 and S2 and the drain electrodes D1 and D2 may have a multiple layers structure of Ti/Al/Ti.

A planarization layer 117 may be arranged to cover the source electrodes S1 and S2 and the drain electrodes D1 and D2. The planarization layer 117 may have a flat top surface so that a first pixel electrode 221 and a second pixel electrode 221' thereon may be formed flat.

The planarization layer 117 may be formed of a single layer or multiple layers of an organic material. The planarization layer 117 may include a general polymer such as benzocyclobutene (BCB), polyimide (PI), hexamethyldisiloxane (HMDSO), polymethylmethacrylate (PMMA), and polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, or a blend thereof.

The planarization layer 117 has an opening for exposing any one of the first source electrode S1 and the first drain electrode D1 of the first thin-film transistor TFT, and the first pixel electrode 221 may contact the first source electrode S1 or the first drain electrode D1 through the opening to be electrically connected to the first thin-film transistor TFT.

In addition, the planarization layer 117 includes an opening exposing any one of the second source electrode S2 and the second drain electrode D2 of the second thin-film transistor TFT', and the second pixel electrode 221' may contact the second source electrode S2 or the second drain electrode D2 through the opening to be electrically connected to the second thin-film transistor TFT'.

The first pixel electrode 221 and the second pixel electrode 221' may include a conductive oxide such as indium tin oxide (ITO), indium zinc oxide (IZO), zinc oxide (ZnO), indium oxide ($In_2O_3$), indium gallium oxide (IGO), and aluminum zinc oxide (AZO). According to some example embodiments, the first pixel electrode 221 and the second pixel electrode 221' may include a reflective layer including Ag, Mg, Al, Pt, Pd, Au, Ni, Nd, Ir, Cr, or a compound thereof. According to some example embodiments, the pixel electrode 131 and the second pixel electrode 221' may further include a film formed of ITO, IZO, ZnO, or $In_2O_3$ above/below the above-described reflective film. In some embodiments, the first pixel electrode 221 and the second pixel electrode 221' may be provided in a structure stacked with ITO/Ag/ITO.

A pixel-defining layer 119 may cover edges of each of the first pixel electrode 221 and second pixel electrode 221'. The pixel-defining layer 119 overlaps each of the first pixel electrode 221 and the second pixel electrode 221', and includes a first opening OP1 and a second opening OP2 defining a light-emitting area of a sub-pixel. The pixel-defining layer 119 may prevent or reduce generation of an arc on edges of the pixel electrodes 221 and 221' by increasing a distance between the edges of the pixel electrodes 221 and 221' and an opposite electrode 223 on the pixel electrodes 221 and 221' pixel electrode 210. The pixel-defining layer 119 may include an organic insulating material such as PI, polyamide, acrylic resin, BCB, HMDSO, and phenolic resin, and may be formed by spin coating.

When the planarization layer 117 and the pixel-defining layer 119 are referred to as an organic insulating layer OL, the organic insulating layer OL may have transmittance of about 90% or more with respect to infrared wavelengths. For example, light having a wavelength of 900 nm to 1100 nm passing through the organic insulating layer OL may have transmittance of about 90%.

A first light-emitting layer 222b and a second light-emitting layer 222b' formed to correspond to the first pixel electrode 221 and the second pixel electrode 221', respectively, are arranged inside the first opening OP1 and the second opening OP2 of the pixel-defining layer 119. The first light-emitting layer 222b and the second light-emitting layer 222b' may each include a polymer material or a low molecular weight material, and may emit red, green, blue, or white light.

An organic functional layer 222e may be arranged above and/or below the first light-emitting layer 222b and the second light-emitting layer 222b'. The organic functional layer 222e may include a first functional layer 222a and/or a second functional layer 222c. The first functional layer 222a or the second functional layer 222c may be omitted.

The first functional layer 222a may be arranged under the first light-emitting layer 222b and the second light-emitting layer 222b'. The first functional layer 222a may be a single layer or multiple layers made of organic materials. The first functional layer 222a may be a hole transport layer (HTL) having a single layer structure. Alternatively, the first functional layer 222a may include a hole injection layer (HIL) and the HTL. The first functional layer 222a may be integrally formed to correspond to the main sub-pixels Pm and the auxiliary sub-pixels Pa included in the first display area DA1 and the second display area DA2. Accordingly, the first functional layer 222a may be arranged corresponding to the transmission portion TA.

The second functional layer 222c may be arranged on the first light-emitting layer 222b and the second light-emitting layer 222b'. The second functional layer 222c may be a single layer or multiple layers made of organic materials. The second functional layer 222c may include an electron transport layer (ETL) and/or an electron injection layer (EIL). The second functional layer 222c may be integrally formed to correspond to the main sub-pixels Pm and the auxiliary sub-pixels Pa included in the first display area DA1 and the second display area DA2. Accordingly, the second functional layer 222c may be arranged corresponding to the transmission portion TA.

The opposite electrode 223 is arranged on the second functional layer 222c. The opposite electrode 223 may include a conductive material having a low work function. For example, the opposite electrode 223 may include a (semi) transparent layer including Ag, Mg, Al, Pt, Pd, Au, Ni, Nd, Ir, Cr, lithium (Li), calcium (Ca), or an alloy thereof. Alternatively, the opposite electrode 223 may further include a layer such as ITO, IZO, ZnO, or $In_2O_3$ on the (semi) transparent layer including the above-mentioned material. The opposite electrode 223 may be integrally formed to correspond to the main sub-pixels Pm and the auxiliary sub-pixels Pa included in the first display area DA1 and the second display area DA2.

Layers from the first pixel electrode 221 to the opposite electrode 223 formed in the first display area DA1 may form the main organic light-emitting diode OLED. Layers from the second pixel electrode 221' to the opposite electrode 223 formed in the second display area DA2 may form the auxiliary organic light-emitting diode OLED'.

An upper layer 250 including an organic material may be formed on the opposite electrode 223. The upper layer 250 may be a layer provided to protect the opposite electrode 223 and to increase light extraction efficiency. The upper layer 250 may include an organic material having a higher refractive index than that of the opposite electrode 223. Alternatively, the upper layer 250 may be provided by stacking layers having different refractive indices. For example, the upper layer 250 may be provided by stacking high refractive index layer/low refractive index layer/high refractive index layer. At this time, a refractive index of the high refractive index layer may be about 1.7 or more, and a refractive index of the low refractive index layer may be about 1.3 or less.

The upper layer 250 may additionally include LiF. Alternatively, the upper layer 250 may additionally include an inorganic insulating material such as $SiO_2$ and $SiN_x$.

According to some example embodiments, the first functional layer 222a, the second functional layer 222c, the opposite electrode 223, and the upper layer 250 may have an opening area TAH corresponding to the transmission portion TA. That is, the first functional layer 222a, the second functional layer 222c, the opposite electrode 223, and the upper layer 250 may have openings corresponding to the transmission portion TA, respectively. The openings of the first functional layer 222a, the second functional layer 222c, the opposite electrode 223, and the upper layer 250 may be formed by a laser. In some embodiments, widths of openings forming the opening area TAH may be substantially the same. For example, a width of the opening of the opposite electrode 223 may be substantially the same as a width of the opening area TAH.

Furthermore, according to some example embodiments, the first functional layer 222a, the second functional layer 222c, and the upper layer 250 may be omitted. In this case, the opening of the opposite electrode 223 may be the opening area TAH.

When the opening area TAH corresponds to the transmission portion TA, it may mean that the opening area TAH overlaps the transmission portion TA. At this time, an area of the opening area TAH may be less than that of a first hole H1 formed in the inorganic insulating layer IL. To this end, FIG. 5 illustrates that a width Wt of the opening area TAH is less than a width W1 of the first hole H1. Here, the area of the opening area TAH and the area of the first hole H1 may be defined as an area of an opening of the narrowest area.

In some embodiments, the first functional layer 222a, the second functional layer 222c, the opposite electrode 223, and the upper layer 250 may be arranged on a side surface of the first hole H1, a second hole H2, and a third hole H3. In some embodiments, an inclination with respect to an upper surface of the substrate 100 on the side surface of the first hole H1, the second hole H2, and the third hole H3 may be gentler than an inclination with respect to an upper surface of the substrate 100 on a side surface of the opening area TAH.

The formation of the opening area TAH means that a member such as the opposite electrode 223 is removed from the transmission portion TA, and thus light transmittance at the transmission portion TA may be significantly increased.

The main organic light-emitting diode OLED and the auxiliary organic light-emitting diode OLED' may be sealed by the encapsulation layer 300. The encapsulation layer 300 may be arranged on the upper layer 250. The encapsulation layer 300 may prevent or reduce instances of external moisture or foreign matter penetrating into the main organic light-emitting diode OLED and the auxiliary organic light-emitting diode OLED'.

The encapsulation layer 300 may include at least one inorganic encapsulation layer and at least one organic encapsulation layer. In this regard, FIG. 5 shows a structure in which the first inorganic encapsulation layer 310, the organic encapsulation layer 320, and the second inorganic encapsulation layer 330 are stacked. According to some example embodiments, the number of organic encapsulation layers, the number of inorganic encapsulation layers, and a stacking order may be changed.

The first inorganic encapsulation layer 310 and the second inorganic encapsulation layer 330 may include one or more inorganic insulating materials such as aluminum oxide, titanium oxide, tantalum oxide, hafnium oxide, zinc oxide, silicon oxide, silicon nitride, or silicon oxynitride, and may be formed by chemical vapor deposition (CVD) or the like. The organic encapsulation layer 320 may include a polymer-based material. Examples of the polymer-based material may include silicone resin, acrylic resin, epoxy resin, polyimide, polyethylene, or the like.

The first inorganic encapsulation layer 310, the organic encapsulation layer 320, and the second inorganic encapsulation layer 330 may be integrally formed to cover a display area DA and a sensor area SA. Accordingly, the first inorganic encapsulation layer 310, the organic encapsulation layer 320, and the second inorganic encapsulation layer 330 may be arranged inside the opening area TAH.

According to some example embodiments, the organic encapsulation layer 320 is integrally formed to cover the display area DA and the sensor area SA, but may not be in the transmission portion TA. In other words, the organic encapsulation layer 320 may include an opening corresponding to the transmission portion TA. In this case, the first inorganic encapsulation layer 310 and the second inorganic encapsulation layer 330 may contact each other within the opening area TAH.

Figure 6:
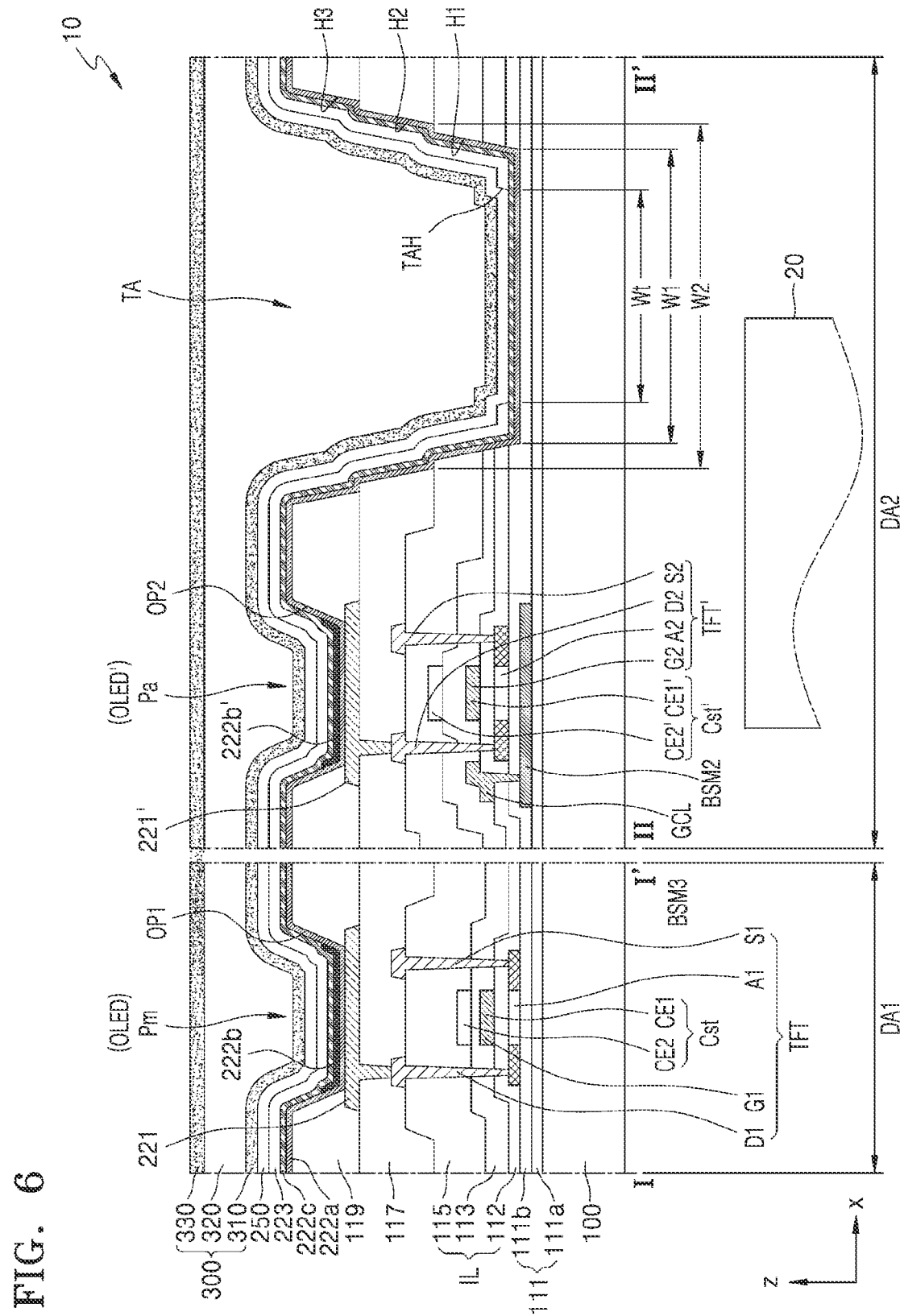
FIG. 6 is a cross-sectional view of another example of a cross-section of the display panel taken along the lines I-I' and II-II' of FIG. 3 according to some example embodiments.

FIG. 6 is a cross-sectional view of another example of a cross-section of the display panel 10 taken along the lines I-I' and II-II' of FIG. 3. In FIG. 6, the same reference numerals as those in FIG. 5 denote the same members, and duplicate descriptions thereof will be omitted and only differences will be described.

Referring to FIG. 6, at least one of the first functional layer 222a, the second functional layer 222c, or the upper layer 250 may be arranged to correspond to the transmission portion TA. That is, at least one of the first functional layer 222a, the second functional layer 222c, or the upper layer 250 may be arranged inside the opening area TAH.

On the other hand, the opposite electrode 223 has an opening corresponding to the transmission portion TA, and the opening may be substantially the same as the width of the opening area TAH. In this case, the opposite electrode 223 may be formed by using a mask provided with a masking film that covers the transmission portion TA.

Figure 7:
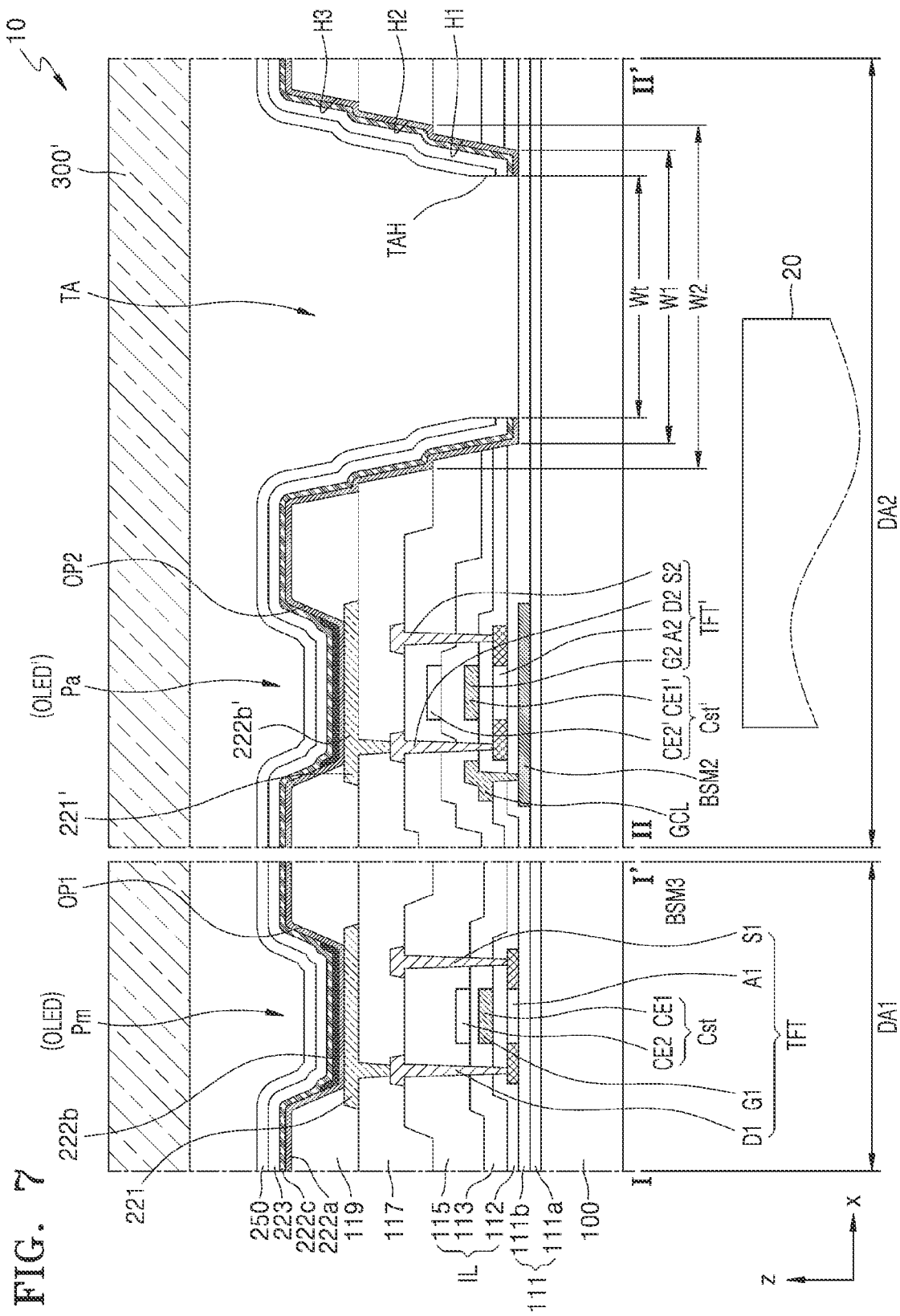
FIG. 7 is a cross-sectional view of another example of a cross-section of the display panel taken along the lines I-I' and II-II' of FIG. 3 according to some example embodiments.

FIG. 7 is a cross-sectional view of another example of a cross-section of the display panel 10 taken along the lines I-I' and II-II' of FIG. 3. In FIG. 7, the same reference numerals as those in FIG. 5 denote the same members, and duplicate descriptions thereof will be omitted and only differences will be described.

Referring to FIG. 7, the main organic light-emitting diode OLED and the auxiliary organic light-emitting diode OLED' may be covered with an encapsulation substrate 300'. The encapsulation substrate 300' includes a transparent material. For example, the encapsulation substrate 300' may include a glass material. Alternatively, the encapsulation substrate 300' may include polymer resin or the like. The encapsulation substrate 300' may prevent or reduce instances of external moisture or foreign matter penetrating into the main organic light-emitting diode OLED and the auxiliary organic light-emitting diode OLED'.

A sealing material such as a sealant may be arranged between the substrate 100 on which the main organic light-emitting diode OLED and the auxiliary organic light-emitting diode OLED' are formed and the encapsulation substrate 300'. The sealing material may block external moisture or foreign matter that may penetrate between the substrate 100 and the encapsulation substrate 300'.

Figure 8:
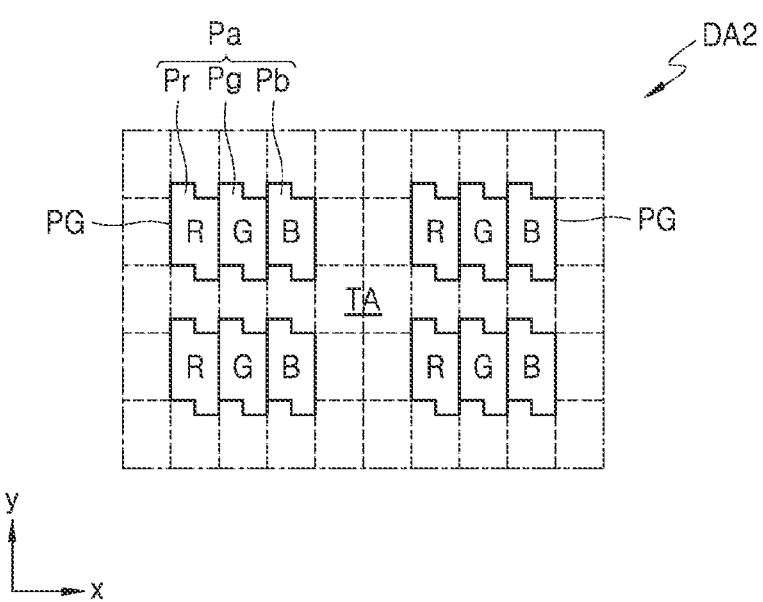
FIG. 8 is a plan view of an example of an arrangement of sub-pixels and a transmission portion in a second display area of FIG. 1 according to some example embodiments.
Figure 9:
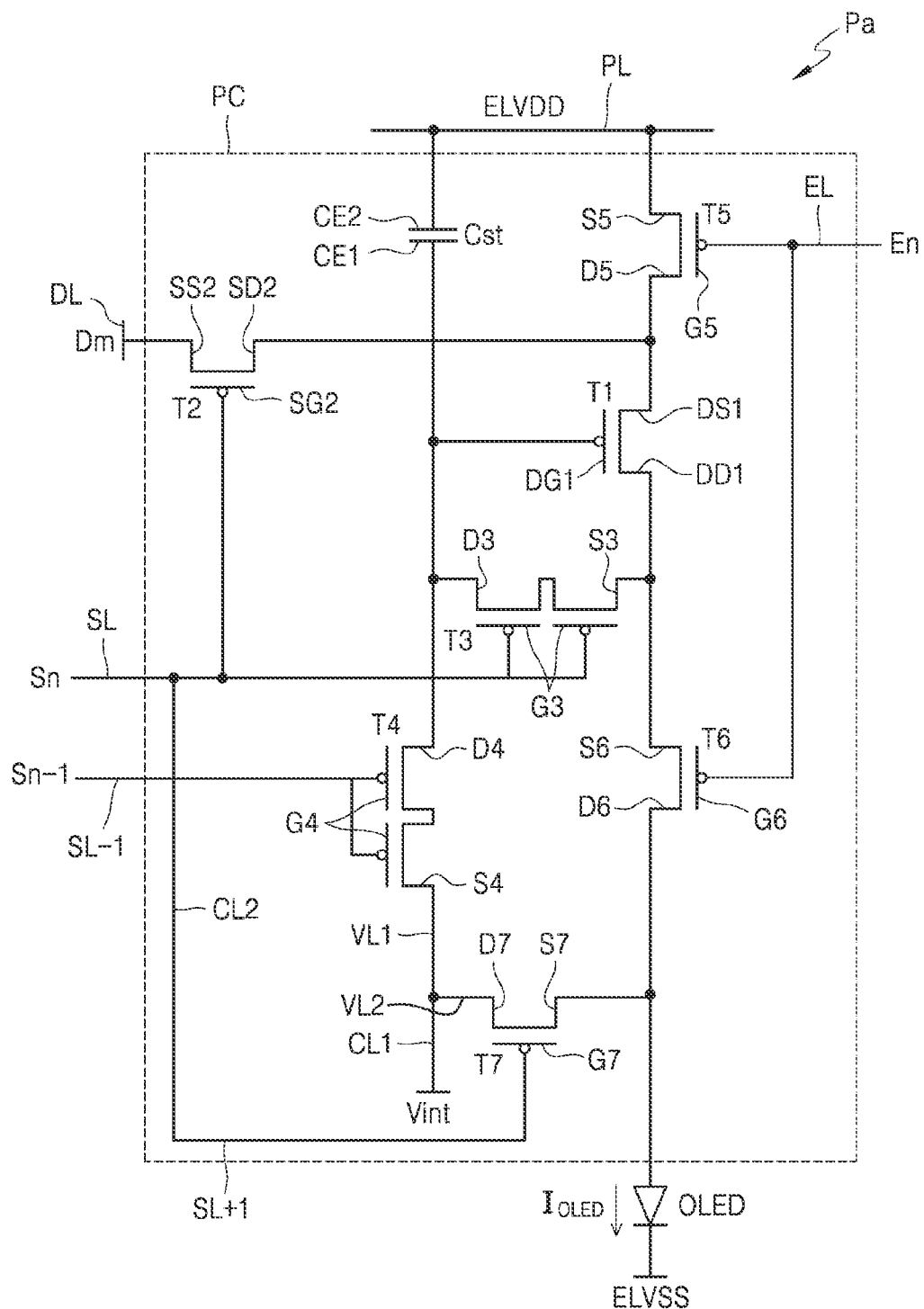
FIG. 9 is an equivalent circuit diagram of one sub-pixel of FIG. 8 according to some example embodiments.
Figure 10:
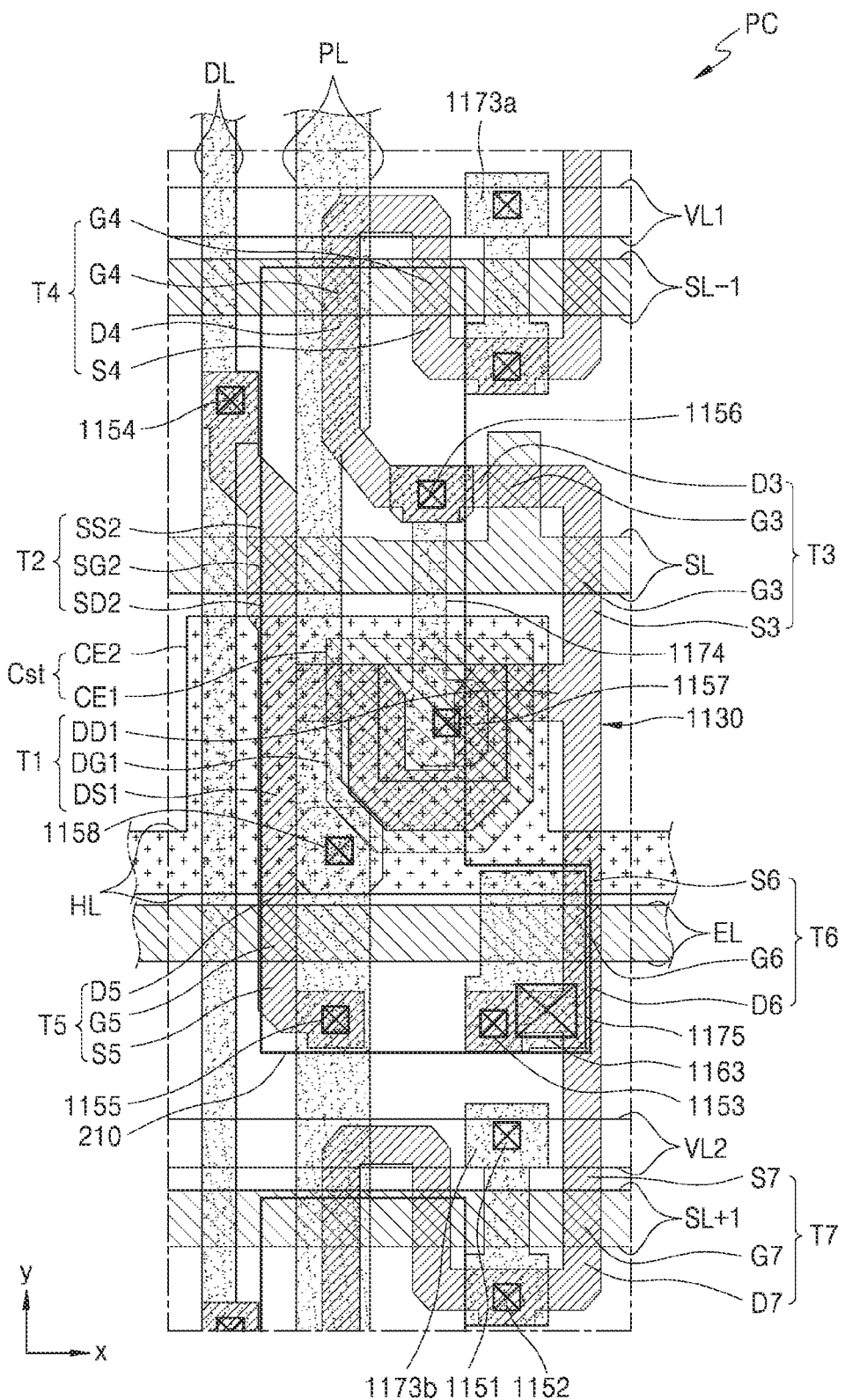
FIG. 10 is a plan view of a structure of a pixel circuit portion of the sub-pixel of FIG. 8 according to some example embodiments.
Figure 11:
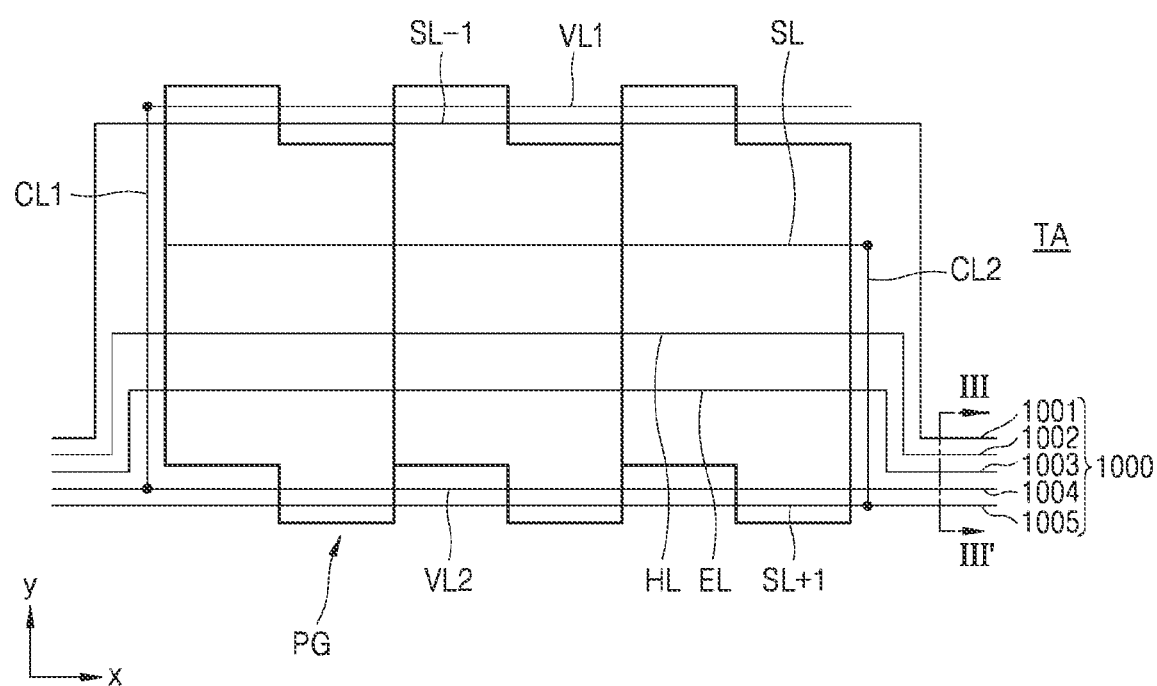
FIG. 11 is a plan view of one pixel group of FIG. 8 according to some example embodiments.
Figure 12:
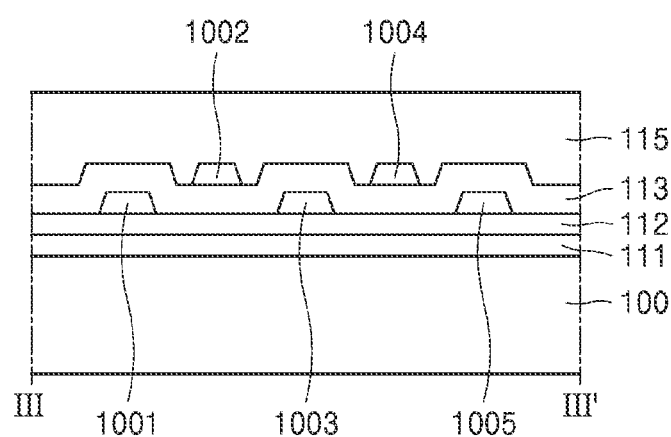
FIG. 12 is a cross-sectional view of an example of a cross-section of the pixel group taken along a line III-III' of FIG. 11 according to some example embodiments.

FIG. 8 is a plan view of an example of arrangement of sub-pixels and a transmission portion arranged in a second display area of FIG. 1, FIG. 9 is an equivalent circuit diagram of one sub-pixel of FIG. 8, FIG. 10 is a plan view of a structure of a pixel circuit unit of the sub-pixel of FIG. 8, FIG. 11 is a plan view of the pixel group of FIG. 8, and FIG. 12 is a cross-sectional view of an example of a cross-section of the pixel group taken along a line III-III' of FIG. 11.

First, referring to FIG. 8, the second display area DA2 may have a pixel groups PG and the transmission portion TA around the pixel group PG. Each of the pixel groups PG includes a plurality of auxiliary sub-pixels Pa. Each of the pixel groups PG is a collection of sub-pixels in which the plurality of auxiliary sub-pixels Pa are set in a preset unit, and pixel groups PG may be apart from each other. The transmission portion TA may be defined as an area between pixel groups PG.

Each of the plurality of auxiliary sub-pixels Pa may include a display element such as the organic light-emitting diode OLED. Each of the auxiliary sub-pixels Pa may emit light of any one of red, green, blue, and white. In FIG. 8, one pixel group PG includes a red sub-pixel Pr, a green sub-pixel Pg, and a blue sub-pixel Pb arranged along one row in a first direction (x direction), and the pixel groups PG are apart from each other in the first direction (x direction) and a second direction (y direction). However, embodiments according to the present disclosure are not limited thereto, and the number or arrangement of auxiliary sub-pixels Pa included in the pixel group PG may be modified according to the resolution of the second display area DA2.

The transmission portion TA is a portion in which the auxiliary sub-pixel Pa is not arranged in the second display area DA2. That is, a pixel electrode constituting the organic light-emitting diode OLED, an intermediate layer including a light-emitting layer and an opposite electrode, and a pixel circuit electrically connected to the organic light-emitting diode OLED may not be arranged in the transmission portion TA. Of course, some of signal lines connected to the auxiliary sub-pixel Pa located in the second display area DA2 to supply a signal may be arranged to cross the transmission portion TA.

Hereinafter, one auxiliary sub-pixel Pa will be described in more detail with reference to FIG. 9. Referring to FIG. 9, one sub-pixel Pa may include a pixel circuit PC and the organic light-emitting diode OLED electrically connected to the pixel circuit PC.

For example, the pixel circuit PC may include a plurality of thin-film transistors T1 to T7 and a storage capacitor Cst. The storage capacitor Cst is the auxiliary storage capacitor Cst' described in FIG. 5. The thin-film transistors T1 to T7 and the storage capacitor Cst may be connected to lines SL−1, SL, SL+1, EL, VL1, VL2, and HL extending in the first direction (x in FIG. 10) and the data line DL and the driving voltage line PL extending in the second direction (y in FIG. 10).

The lines SL−1, SL, SL+1, EL, VL1, VL2, and HL extending in the first direction may include the first scan line SL−1 configured to transmit the previous scan signal Sn−1 to the first initialization thin-film transistor T4, the second scan line SL configured to transmit a scan signal Sn, the third scan line SL+1 configured to transmit the scan signal Sn to the second initialization thin-film transistor T7, the emission control line EL configured to transmit an emission control signal En to the operation control thin-film transistor T5 and the emission control thin-film transistor T6, the first initialization voltage line VL1 configured to transmit an initialization voltage Vint to the first initialization thin-film transistor T4, the second initialization voltage line VL2 configured to transmit the initialization voltage Vint to the second initialization thin-film transistor T7, and the electrode voltage line HL forming an upper electrode CE2 of the storage capacitor Cst. The upper electrode CE2 is the second upper electrode CE2' described in FIG. 5.

The data line DL crosses the second scan line SL and transmits a data signal Dm to the switching thin-film transistor T2, and the driving voltage line PL is connected to the electrode voltage line HL and transmits the driving voltage ELVDD to the driving thin-film transistor T1.

A driving gate electrode DG1 of the driving thin-film transistor T1 is connected to a lower electrode CE1 of the storage capacitor Cst, a driving source electrode DS1 of the driving thin-film transistor T1 is connected to the driving voltage line PL via the operation control thin-film transistor T5, and a driving drain electrode DD1 of the driving thin-film transistor T1 is electrically connected to a pixel electrode of the organic light-emitting diode OLED via the emission control thin-film transistor T6. The driving thin-film transistor T1 receives the data signal Dm according to a switching operation of the switching thin-film transistor T2 and supplies a driving current $I_{OLED}$ to the organic light-emitting diode OLED.

A switching gate electrode SG2 of the switching thin-film transistor T2 is connected to the second scan line SL, a switching source electrode SS2 of the switching thin-film transistor T2 is connected to the data line DL, and a switching drain electrode SD2 of the switching thin-film transistor T2 is connected to the driving source electrode DS1 of the driving thin-film transistor T1 and connected to a driving voltage line PL through the operation control thin-film transistor T5. The switching thin-film transistor T2 is turned on in response to the scan signal Sn received through the second scan line SL and performs a switching operation for transmitting the data signal Dm transmitted to the data line DL to the driving source electrode DS1 of the driving thin-film transistor T1.

A compensation gate electrode G3 of the compensation thin-film transistor T3 is connected to the second scan line SL, a compensation source electrode S3 of the compensation thin-film transistor T3 is connected to the driving drain electrode DD1 of the driving thin-film transistor T1 and connected to the pixel electrode of the organic light-emitting element OLED via the emission control thin-film transistor T6, and a compensation drain electrode D3 of the compensation thin-film transistor T3 is connected to the lower electrode CE1 of the storage capacitor Cst, a first initialization drain electrode D4 of the first initialization thin-film transistor T4, and the driving gate electrode DG1 of the driving thin-film transistor T1. The compensation thin-film transistor T3 is turned on in response to the scan signal Sn received through the second scan line SL and electrically connects the driving gate electrode DG1 to the driving drain electrode DD1 of the driving thin-film transistor T1 to diode-connect the driving thin-film transistor T1.

A first initialization gate electrode G4 of the first initialization thin-film transistor T4 is connected to the first scan line SL−1, a first initialization source electrode S4 of the first initialization thin-film transistor T4 is connected to the first initialization voltage line VL1, and the first initialization drain electrode D4 of the first initialization thin-film transistor T4 is connected to the lower electrode CE1 of the storage capacitor Cst, the compensation drain electrode D3 of the compensation thin-film transistor T3, and the driving gate electrode G1 of the driving thin-film transistor T1. The first initialization thin-film transistor T4 is turned on in response to the previous scan signal Sn−1 received through the first scan line SL−1 and initializes a voltage of the driving gate electrode DG1 of the driving thin-film transistor T1 by transmitting the initialization voltage Vint to the driving gate electrode DG1 of the driving thin-film transistor T1.

An operation control gate electrode G5 of the operation control thin-film transistor T5 is connected to the emission control line EL, an operation control source electrode S5 of the operation control thin-film transistor T5 is connected to the driving voltage line PL, and an operation control drain electrode D5 of the operation control thin-film transistor T5 is connected to the driving source electrode DS1 of the driving thin-film transistor T1 and the switching drain electrode SD2 of the switching thin-film transistor T2.

An emission control gate electrode G6 of the emission control thin-film transistor T6 is connected to the emission control line EL, an emission control source electrode S6 of the emission control thin-film transistor T6 is connected to the driving drain electrode DD1 of the driving thin-film transistor T1 and the compensation source electrode S3 of the compensation thin-film transistor T3, and an emission control drain electrode D6 of the emission control thin-film transistor T6 is electrically connected to a second initialization source electrode S7 of the second initialization thin-film transistor T7 and the pixel electrode of the organic light-emitting diode OLED.

The operation control thin-film transistor T5 and the emission control thin-film transistor T6 are simultaneously turned on in response to the emission control signal En received through the emission control line EL so that the driving voltage ELVDD is transmitted to the main organic light-emitting diode OLED and the driving current $I_{OLED}$ flows through the main organic light-emitting diode OLED.

A second initialization gate electrode G7 of the second initialization thin-film transistor T7 is connected to the third scan line SL+1, the second initialization source electrode S7 of the second initialization thin-film transistor T7 is connected to the emission control drain electrode D6 of the emission control thin-film transistor T6 and a pixel electrode of the main organic light-emitting diode OLED, and a second initialization drain electrode D7 of the second initialization thin-film transistor T7 is connected to the second initialization voltage line VL2. Meanwhile, the first initialization voltage line VL1 and the second initialization voltage line VL2 are electrically connected to each other by a first connection line CL1, and the same initialization voltage Vint may be applied.

Meanwhile, because the second scan line SL and the third scan line SL+1 are electrically connected to each other by a second connection line CL2, the same scan signal Sn may be applied. Accordingly, the second initialization thin-film transistor T7 may be turned on in response to the scan signal Sn received through the third scan line SL+1 to initialize the pixel electrode of the organic light-emitting diode OLED.

The upper electrode CE2 of the storage capacitor Cst is connected to the driving voltage line PL and an opposite electrode of the organic light-emitting diode OLED is connected to a common voltage ELVSS. Accordingly, the organic light-emitting diode OLED may receive the driving current $I_{OLED}$ from the driving thin-film transistor T1 and emit light to display an image.

Meanwhile, FIG. 9 shows that the compensation thin-film transistor T3 and the first initialization thin-film transistor T4 have a dual gate electrode. However, the compensation thin-film transistor T3 and the first initialization thin-film transistor T4 have one gate electrode.

Hereinafter, a structure of a pixel circuit PC will be described in detail with reference to FIG. 10.

The driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130, and some areas of the semiconductor layer 1130 may form semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7.

The first gate insulating layer 112 (of FIG. 5) is located on the semiconductor layer 1130, and the first scan line SL−1, the second scan line SL, the third scan line SL+1, and the emission control line EL may be located on the first gate insulating layer 112 (of FIG. 5).

Meanwhile, areas of the second scan line SL overlapping channel areas of the switching and compensation thin-film transistors T2 and T3 may be the switching and compensation gate electrodes SG2 and G3, respectively. An area of the first scan line SL−1 overlapping channel areas of the first initialization thin-film transistor T4 may be the first initialization gate electrode G4. An area of the third scan line SL+1 overlapping a channel area of the second initialization thin-film transistor T7 may be the second initialization gate electrode G7. Areas of the emission control line EL overlapping channel areas of the operation control and the emission control driving thin-film transistors T5 and T6 may be the operation control and the emission control gate electrodes G5 and G6, respectively.

The second gate insulating layer 113 (of FIG. 5) may be provided on the first scan line SL−1, the second scan line SL, the third scan line SL+1, and the emission control line EL, and the electrode voltage line HL, the first initialization voltage line VL1, and the second initialization voltage line VL2 may be arranged on the second gate insulating layer 113 (of FIG. 5). The electrode voltage line HL covers at least a portion of the driving gate electrode DG1 and may form the storage capacitor Cst together with the driving gate electrode DG1.

The lower electrode CE1 of the storage capacitor Cst may be integrally formed with the driving gate electrode DG1 of the driving thin-film transistor T1. For example, the driving gate electrode DG1 of the driving thin-film transistor T1 may serve as the lower electrode CE1 of the storage capacitor Cst. An area of the electrode voltage line HL overlapping the driving gate electrode DG1 may be the upper electrode CE2 of the storage capacitor Cst. Therefore, the second gate insulating layer 113 (of FIG. 5) may serve as a dielectric layer of the storage capacitor Cst.

The interlayer insulating layer 115 (of FIG. 5) may be located on the electrode voltage line HL, the first initialization voltage line VL1, and the second initialization voltage line VL2. The data line DL, the driving voltage line PL, first and second initialization connection lines 1173a and 1173b, a node connection line 1174, and a connection metal 1175 may be arranged on the interlayer insulating layer 115 (of FIG. 5). The data line DL, the driving voltage line PL, the node connection line 1174, and the connection metal 1175 may include a conductive material including Mo, Al, Cu, Ti, or the like, and may be formed as a single layer or multiple layers including the above-described materials. For example, the data line DL, the driving voltage line PL, the node connection line 1174, and the connection metal 1175 may be formed of a multilayer structure of Ti/Al/Ti.

The data line DL may be connected to a switching source electrode SS2 of the switching thin-film transistor T2 through a contact hole 1154.

The driving voltage line PL may be connected to the upper electrode CE2 of a storage capacitor Cst through a contact hole 1158 formed in the interlayer insulating layer 115 (of FIG. 5). Therefore, the electrode voltage line HL may have the same voltage level (constant voltage) as that of the driving voltage line PL. Furthermore, the driving voltage line PL may be connected to the operation control drain electrode D5 through a contact hole 1155.

The first initialization voltage line VL1 may be connected to the first initialization thin-film transistor T4 through the first initialization connection line 1173a, and the second initialization voltage line VL2 may be connected to the second initialization thin-film transistor T7 through the second initialization connection line 1173b. Meanwhile, as described in FIG. 9, the first initialization voltage line VL1 and the second initialization voltage line VL2 may be electrically connected to each other by the first connection line CL1 and have a constant voltage (e.g., −2 V, etc.).

One end of the node connecting line 1174 may be connected to the compensation drain electrode D3 through a contact hole 1156 and the other end may be connected to the driving gate electrode DG1 through a contact hole 1157.

The connection metal 1175 is connected to a semiconductor layer A6 of the emission control thin-film transistor T6. The emission control thin-film transistor T6 may be electrically connected to a pixel electrode of the organic light-emitting diode OLED (of FIG. 9) through the connection metal 1175.

The planarization layer 117 (of FIG. 5) is located on the data line DL, the driving voltage line PL, the first and second initialization connection lines 1173a and 1173b, the node connection line 1174, and the connection metal 1175, and the organic light-emitting diode OLED (of FIG. 9) may be located on the planarization layer 117.

Meanwhile, as shown in FIG. 11, the lines SL−1, SL, SL+1, EL, VL1, VL2, and HL (hereinafter referred to as first horizontal lines) extending in the first direction (x direction) cross one pixel group PG and may be electrically connected to the plurality of auxiliary sub-pixels Pa included in the pixel group PG, respectively. In addition, the first horizontal lines respectively included in two pixel groups PG adjacent to each other in the first direction (x direction) are arranged between the two pixel groups PG and may be electrically connected to each other by extension lines 1000 extending in the first direction (x direction). At this time, the number of extension lines 1000 may be less than the number of first horizontal lines. Accordingly, the number of lines arranged in the transmission portion TA is reduced than when the first horizontal lines cross the transmission portion TA between adjacent pixel groups PG, and thus the transmittance of the transmission portion TA may be improved. The extension lines 1000 may be integrally formed with some of the first horizontal lines.

For example, the first initialization voltage line VL1 and the second initialization voltage line VL2 among the first horizontal lines may be connected to each other by the first connection line CL1. The first connection line CL1 may be located on a different layer from that of the first horizontal lines. For example, the first connection line CL1 may be located on the same layer as that of the data line DL and the driving voltage line PL. Among the first initialization voltage line VL1 and the second initialization voltage line VL2, only the second initialization voltage line VL2 extends to the transmission portion TA to form a fourth extension line 1004. Meanwhile, FIG. 11 shows that the first connection line CL1 is located on the left side of the pixel group PG based on the drawing, but embodiments according to the present disclosure are not limited thereto, and the first connection line CL1 may be located on the right side of the pixel group PG based on the drawing, or may be arranged on the left and right sides of the pixel group PG.

In addition, the second scan line SL and the third scan line SL+1 may be connected to each other by the second connection line CL2 to receive the same scan signal, and only the third scan line SL+1 may extend to the transmission portion TA to form a fifth extension line 1005. For example, the second connection line CL2 is located on the same layer as or a different layer from that of the first connection line CL1, but the first connection line CL1 and the second connection line CL2 may be arranged on opposite sides of the pixel group PG. As another example, the second connection line CL2 may be located on the same side as the first connection line CL1, or may be arranged on both sides of the pixel group PG based on the drawing.

Therefore, according to the positions of the first connection line CL1 and the second connection line CL2, based on the drawing, there may be a difference in the number of contact holes to which the extension lines 1000 are connected at both sides of the pixel group PG.

Meanwhile, a first extension line 1001 may be integrally formed with the first scan line SL−1, a second extension line 1002 may be integrally formed with the electrode voltage line HL, and a third extension line 1003 may be integrally formed with the emission control line EL. Therefore, because seven first horizontal lines crossing one pixel group PG are connected to five extension lines 1001,1002,1003, 1004, and 1005, the number of lines arranged in the transmission portion TA is reduced, so that the transmittance of the transmission portion TA may be improved.

Meanwhile, the extension lines 1000 may be located adjacent to each other in the transmission portion TA. That is, a width of an area in which the extension lines 1000 in the second direction (y direction) are arranged is less than a width of an area in which the first horizontal lines in the second direction (y direction) are arranged. Therefore, compared to a case where the extension lines 1000 are widely distributed in the transmission portion TA, interference by the extension lines 1000 may be reduced when the component 20 (of FIG. 5) transmits and receives a signal.

In addition, as shown in FIG. 12, two adjacent extension lines of the extension lines 1000 may be located on different layers. For example, the first extension line 1001, the third extension line 1003, and the fifth extension line 1005 may be located on the first gate insulating layer 112, and the second extension line 1002 and the fourth extension line 1004 may be located on the second gate insulating layer 113. Also, at least some of adjacent extension lines may be located to overlap each other in a vertical direction. Therefore, a distance between the extension lines 1000 on a plane is reduced, so that the transmittance of the transmission portion TA may be improved.

However, embodiments according to the present disclosure are not limited thereto, and any one or more of the extension lines 1000 may be arranged at various positions, such as on the interlayer insulating layer 115. For example, the third extension line 1003 located in the middle of the extension lines 1000 may be located on the interlayer insulating layer 115 and may be electrically connected to the emission control line EL through a contact hole. As a result, an area in which the extension lines 1000 are arranged is further reduced, so that the transmittance of the transmission portion TA may be further improved.

Meanwhile, the first extension line 1001 may be integrally formed with the first scan line SL−1, the second extension line 1002 may be integrally formed with the electrode voltage line HL, and the third extension line 1003 may be integrally formed with the emission control line EL. The first extension line 1001 may be located on a different layer from that of the first scan line SL−1 and may be electrically connected to the first scan line SL−1 through a contact hole.

Figure 13:
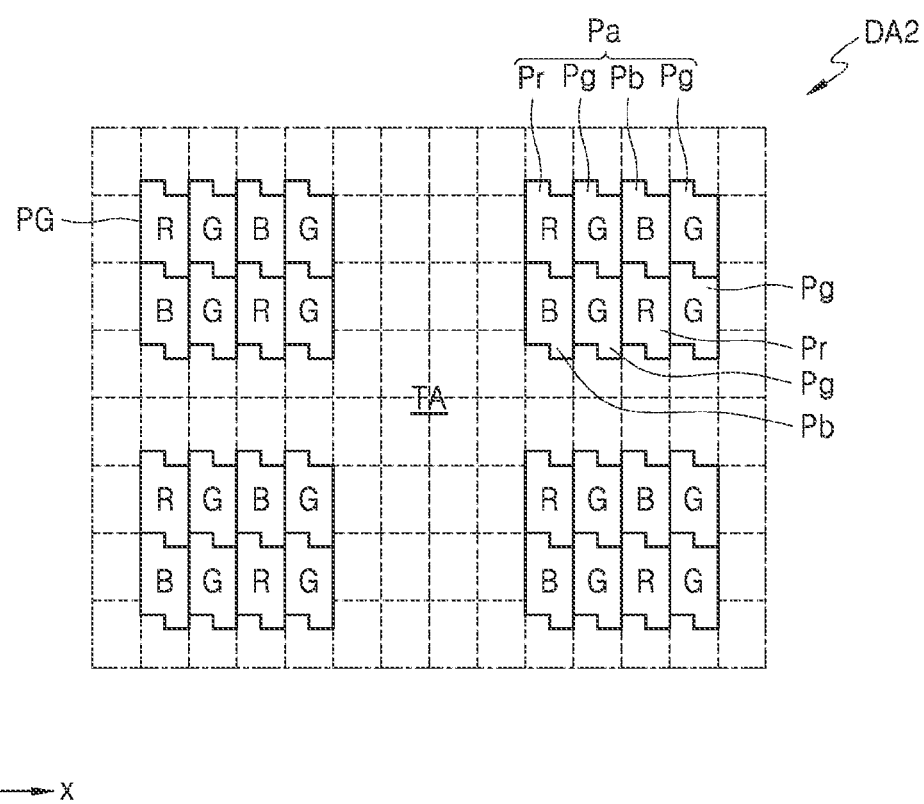
FIG. 13 is a plan view of an example of an arrangement of sub-pixels and a transmission portion in a second display area of FIG. 1 according to some example embodiments.
Figure 14:
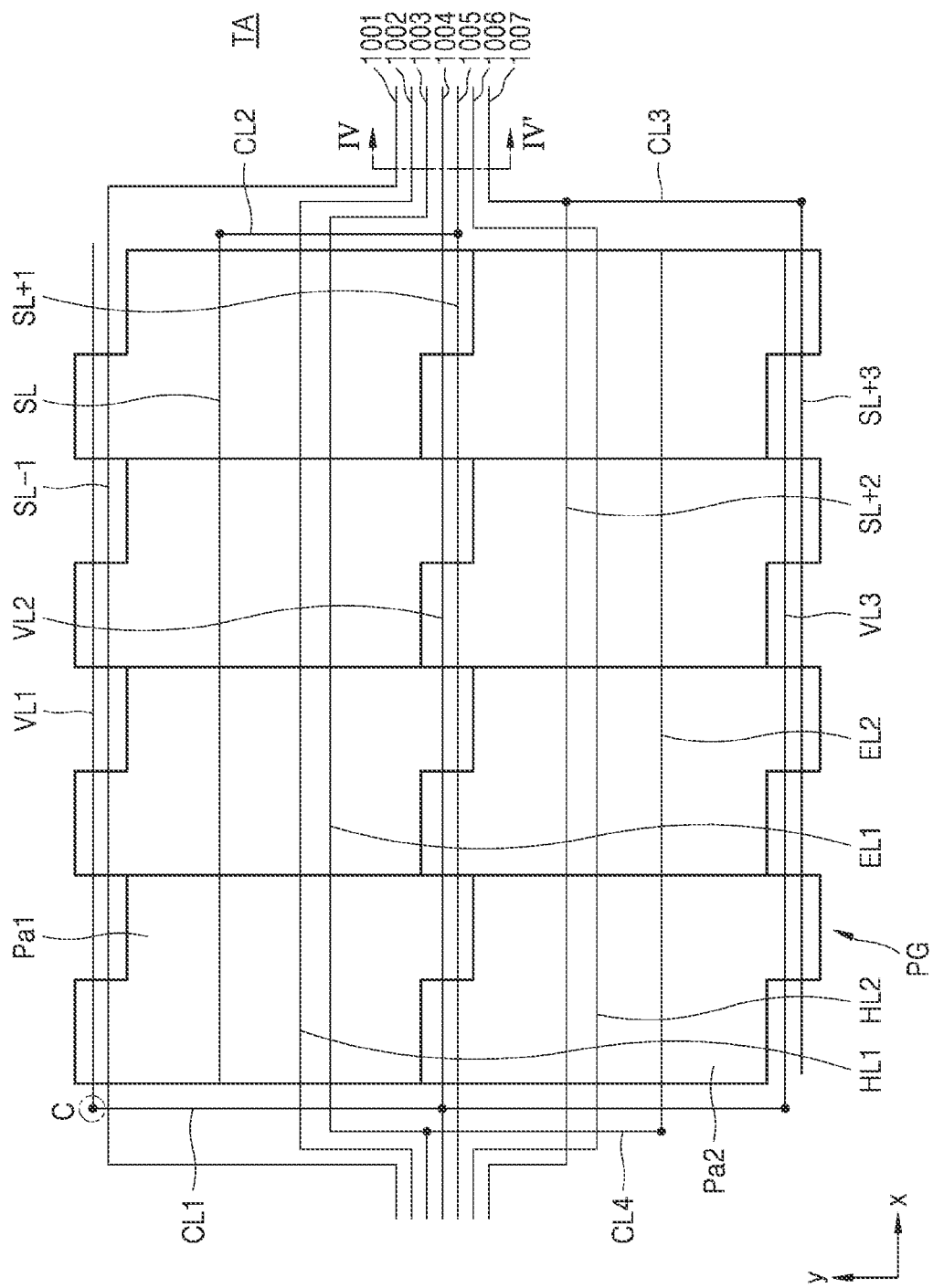
FIGS. 14 and 15 are plan views of one pixel group of FIG. 13 according to some example embodiments.
Figure 15:
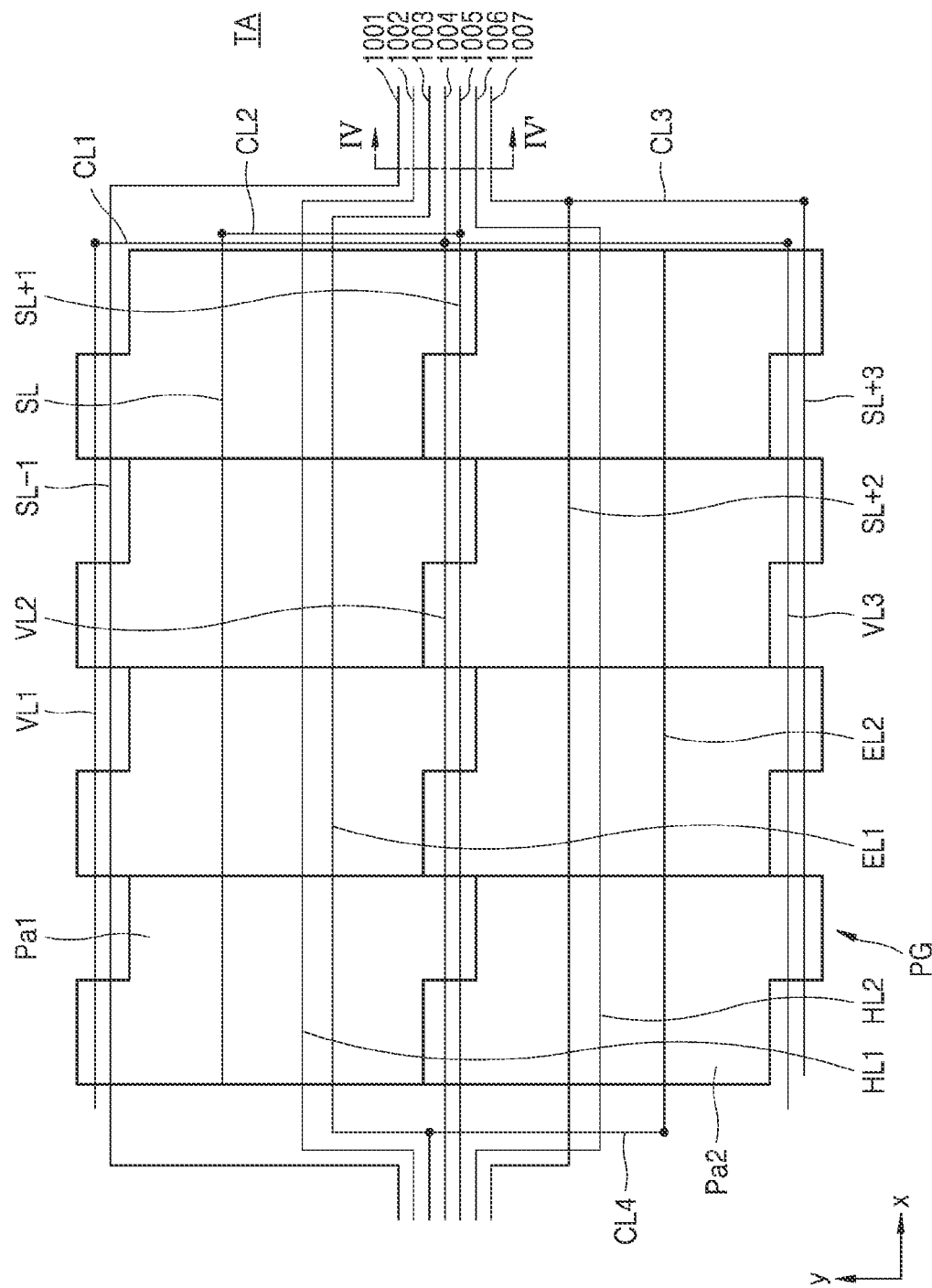
Figure 16:
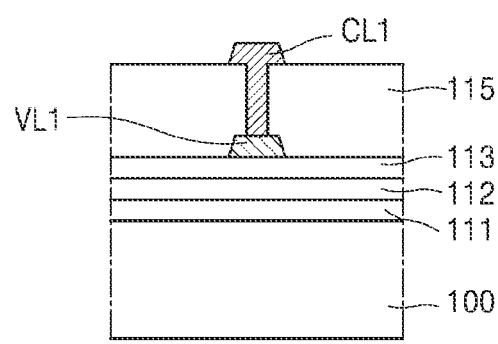
FIG. 16 is a cross-sectional view of an example of portion C of FIG. 14 according to some example embodiments.
Figure 17:
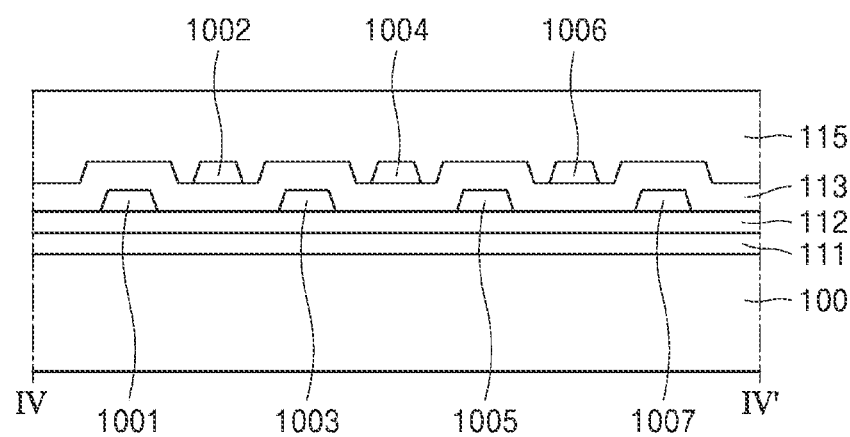
FIG. 17 is a cross-sectional view of an example of a cross-section of the pixel group taken along a line IV-IV' of FIG. 14 according to some example embodiments.

FIG. 13 is a plan view of an example of arrangement of sub-pixels and a transmission portion arranged in the second display area of FIG. 1, FIGS. 14 and 15 are plan views of one pixel group of FIG. 13, FIG. 16 is a cross-sectional view of an example of portion C of FIG. 14, and FIG. 17 is a cross-sectional view of an example of a cross-section of the pixel group taken along a line IV-IV' of FIG. 14.

Referring to FIG. 13, the second display area DA2 may include a plurality of pixel groups PG and the transmission portion TA.

FIG. 13 shows that one pixel group PG includes a red sub-pixel Pr, a green sub-pixel Pg, a blue sub-pixel Pb, and a green sub-pixel Pg arranged in the first direction (x direction), and the blue sub-pixels Pb, the green sub-pixels Pg, the red sub-pixels Pr, and the green sub-pixels Pg arranged in the first direction (x direction) in parallel with different rows, and the auxiliary sub-pixels Pa are arranged in a pentile type. However, embodiments according to the present disclosure are not necessarily limited thereto, and the number or arrangement of auxiliary sub-pixels Pa included in the pixel group PG may be modified according to the resolution of the second display area DA2.

The transmission portion TA may be arranged to surround the pixel group PG. However, embodiments according to the present disclosure are not limited thereto, and the pixel groups PG are alternately arranged in a lattice shape, and the transmission portion TA may be located between the pixel groups PG.

A plurality of extension lines 1001 to 1007 located between the pixel groups PG and extending in the first direction (x direction) may be located in the transmission portion TA. The plurality of extension lines 1001 to 1007 may be electrically connected to second horizontal lines that cross one pixel group PG in the first direction (x direction).

When the auxiliary sub-pixels Pa may be arranged in the pentile type shown in FIG. 13, the first initialization voltage line VL1, the first scan line SL−1, the second scan line SL, a first electrode voltage line HL1, a first emission control line EL1, the second initialization voltage line VL2, and the third scan line SL+1 may be electrically connected to a first auxiliary sub-pixel Pa1 while crossing the first auxiliary sub-pixel Pa1 included in a first row in the first direction (x direction), and the second initialization voltage line VL2, the third scan line SL+1, a fourth scan line SL+2, a second electrode voltage line HL2, a second emission control line EL2, a third initialization voltage line VL3, and a fifth scan line SL+3 may be electrically connected to a second auxiliary sub-pixel Pa2 while crossing the second auxiliary sub-pixel Pa2 included in a second row in the first direction (x direction). In this case, the second auxiliary sub-pixel Pa2 may be arranged adjacent to the first auxiliary sub-pixel Pa1 in the second direction (y direction).

Meanwhile, the second initialization voltage line VL2 and the third scan line SL+1 may be shared by the first auxiliary sub-pixel Pa1 and the second auxiliary sub-pixel Pa2.

Accordingly, the second initialization voltage line VL2 may be electrically connected to the second initialization thin-film transistor T7 (of FIG. 9) of the first auxiliary sub-pixel Pa1 and the first initialization thin-film transistor T4 (of FIG. 9) of the second auxiliary sub-pixel Pa2. In addition, the third scan line SL+1 is electrically connected to the first initialization thin-film transistor T4 (of FIG. 9) of the second auxiliary sub-pixel Pa2, and a scan signal applied to the third scan line SL+1 may be transmitted as a previous scan signal to the first initialization thin-film transistor T4 (of FIG. 9) of the second auxiliary sub-pixel Pa2.

That is, in FIG. 14, the second horizontal lines extending in the first direction (x direction) and crossing one pixel group PG may include twelve of the first initialization voltage line VL1, the first scan line SL−1, the second scan line SL, the first electrode voltage line HL1, the first emission control line EL1, the second initialization voltage line VL2, the third scan line SL+1, the fourth scan line SL+2, the second electrode voltage line HL2, the second emission control line EL2, the third initialization voltage line VL3, and the fifth scan line SL+3.

Meanwhile, second horizontal lines included in each of the pixel groups PG are electrically connected to each other by the connection lines 1001 to 1007 extending in the first direction (x direction) in the transmission portion TA. In this case, the number of extension lines 1001 to 1007 may be less than the number of second horizontal lines, and the extension lines 1001 to 1007 may be integrally formed with some of the first horizontal lines.

For example, among the second horizontal lines, the first initialization voltage line VL1 and the second initialization voltage line VL2 described above may be electrically connected to the third initialization voltage line VL3 crossing the second row in the first direction (x direction) by the first connection line CL1. The third initialization voltage line VL3 may apply an initialization voltage to the second initialization thin-film transistor T7 (of FIG. 9) of the second auxiliary sub-pixel Pa2. Meanwhile, for example, among the first initialization voltage line VL1, the second initialization voltage line VL2, and the third initialization voltage line VL3, only the second initialization voltage line VL2 may extend to the transmission portion TA to form the fourth extension line 1004. Meanwhile, FIG. 14 shows that the first connection line CL1 is located on the left side of the pixel group PG based on the drawing, but embodiments according to the present disclosure are not limited thereto. As shown in FIG. 15, the first connection line CL1 may be located on the right side of the pixel group PG based on the drawing. Also, the first connection line CL1 may be arranged on both sides of the pixel group PG based on the drawing.

Meanwhile, the first connection line CL1 may be in contact with each other on a different layer from or the same layer as that of the first initialization voltage line VL1, the second initialization voltage line VL2, and the third initialization voltage line VL3. For example, FIG. 16 schematically illustrates a cross-section of the contact portion of the first connection line CL1 and the first initialization voltage line VL1 in FIG. 14. As illustrated in FIG. 16, the first initialization voltage line VL1 may be located on the second gate insulating layer 113 and the first connection line CL1 may be located on the interlayer insulating layer 115.

In addition, the second scan line SL and the third scan line SL+1 may be connected to each other by the second connection line CL2 to receive the same scan signal, and only the third scan line SL+1 may extend to the transmission portion TA to form the fifth extension line 1005.

Further, the fourth scan line SL+2 and the fifth scan line SL+3 crossing a second row in the first direction (x direction) may be connected to each other by a third connection line CL3, and only the fourth scan line SL+2 may be extended to the transmission portion TA to form the seventh extension line 1007.

Meanwhile, FIGS. 14 and 15 illustrate that the second connection line CL2 and the third connection line CL3 are located on the right side of the pixel group PG based on the drawing, but embodiments according to the present disclosure are not limited thereto. The second connection line CL2 and the third connection line CL3 may be located on the left side of the pixel group PG based on the drawing, or at least one of the second connection line CL2 or the third connection line CL3 may be arranged on the left and right sides of the pixel group PG.

In addition, the first emission control line EL1 crossing a first row in the first direction (x direction) and the second emission control line EL2 crossing a second row in the first direction (x direction) may be electrically connected to each other by a fourth connection line CL4, and may be electrically connected to the third extension line 1003. Accordingly, the same emission control signal may be transmitted to the first auxiliary sub-pixel Pa1 and the second auxiliary sub-pixel Pa2. Meanwhile, the third extension line 1003 may be formed by extending the first emission control line EL1, or may be formed of a separate line arranged on a different layer from that of the first emission control line EL1. Meanwhile, FIGS. 14 and 15 show that the fourth connection line CL4 is located on the left side of the pixel group PG based on the drawing, but embodiments according to the present disclosure are not limited thereto. The fourth connection line CL4 may be located on the right side of the pixel group PG based on the drawing, or may be arranged on the left and right sides of the pixel group PG.

The first connection line CL1, the second connection line CL2, the third connection line CL3, and the fourth connection line CL4 described above may be located on a different layer from that of the second horizontal lines. For example, the first connection line CL1, the second connection line CL2, the third connection line CL3, and the fourth connection line CL4 may be located on the interlayer insulating layer 115.

Meanwhile, the first extension line 1001 may be integrally formed with the first scan line SL−1, the second extension line 1002 may be integrally formed with the first electrode voltage line HL1, and a sixth extension line 1006 may be integrally formed with the second electrode voltage line HL2.

Therefore, because 12 second horizontal lines crossing one pixel group PG are connected to seven extension lines 1001 to 1007, the number of lines arranged in the transmission portion TA is reduced, so that the transmittance of the transmission portion TA may be improved. Further, the extension lines 1001 to 1007 may be located adjacent to each other in the middle of the pixel group PG. That is, on a plane, a width of an area in which the extension lines 1001 to 1007 in the second direction (y direction) is arranged is less than a width of an area in which the second horizontal lines in the second direction (y direction) are arranged. As a result, compared to a case where the extension lines 1001 to 1007 are widely distributed in the transmission portion TA, interference by the extension lines 1001 to 1007 may be reduced when the component 20 (of FIG. 5) transmits and receives a signal.

In addition, as shown in FIG. 15, two adjacent extension lines of the extension lines 1001 to 1007 may be located on different layers. For example, the first extension line 1001, the third extension line 1003, the fifth extension line 1005, and the seventh extension line 1007 may be located on the first gate insulating layer 112, and the second extension line 1002, the fourth extension line 1004, and the sixth extension line 1006 may be located on the second gate insulating layer 113. Also, at least some of adjacent extension lines may be located to overlap each other in a vertical direction. Therefore, a distance between the extension lines 1001 to 1007 on a plane is reduced, so that the transmittance of the transmission portion TA may be improved.

However, embodiments according to the present disclosure are not limited thereto, and any one or more of the extension lines 1001 to 100 may be arranged at various positions, such as on the interlayer insulating layer 115, and may be located to overlap other extension lines 1001 to 1007. For example, the third extension line 1003 located in the middle of the extension lines 1001 to 1007 may be located on the interlayer insulating layer 115 and may be electrically connected to the first emission control line EL1 through a contact hole. In this case, because the third extension line 1003 may also be located to overlap another adjacent extension line, for example, the first extension line 1001 or the fifth extension line 1005, an arrangement area of the extension lines 1001 to 1007 may be further reduced. As a result, the transmittance of the transmission portion TA may be further improved.

Figure 18:
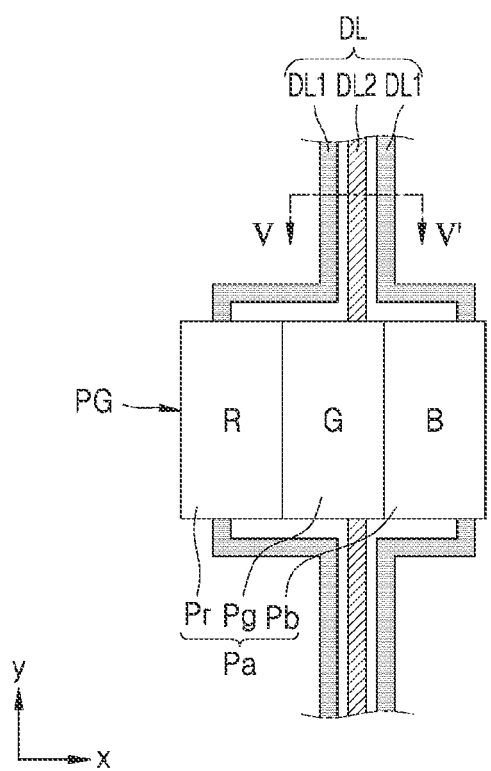
FIGS. 18 and 20 are plan views of an example of sub-pixels arranged in a second display area of FIG. 1 according to some example embodiments.
Figure 19:
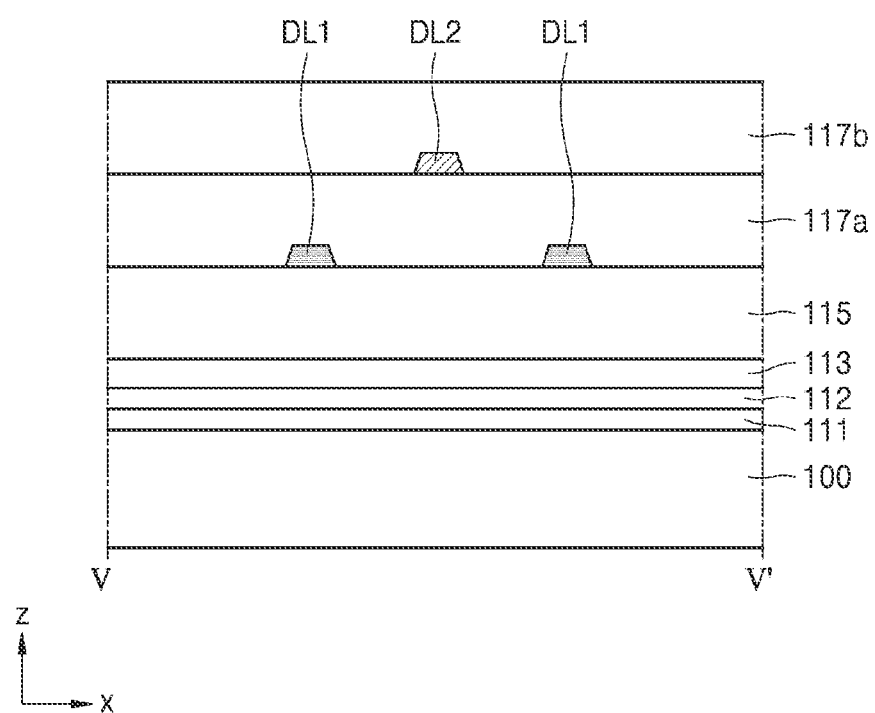
FIG. 19 is a cross-sectional view of an example of a cross-section of the sub-pixels taken along a line V-V' of FIG. 18.
Figure 20:
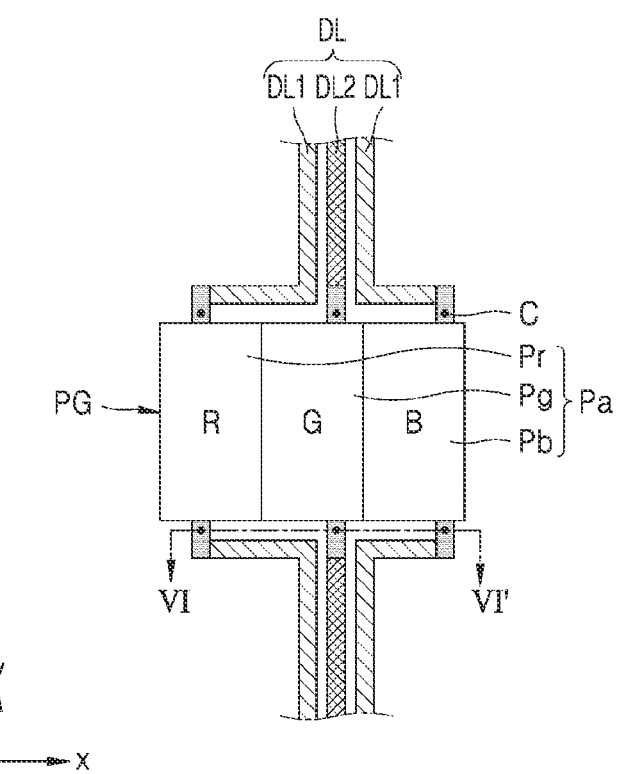
Figure 21:
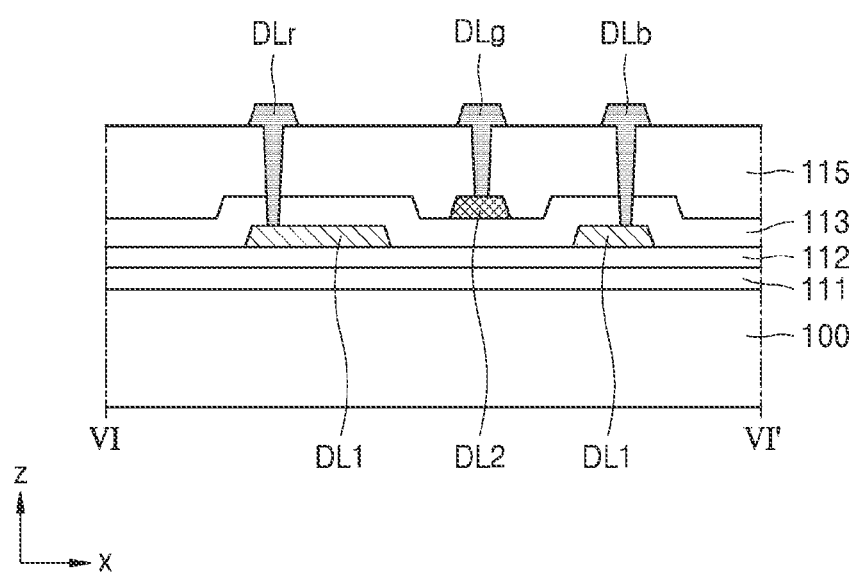
FIG. 21 is a cross-sectional view of an example of a cross-section of the sub-pixels taken along a line VI-VI' of FIG. 20 according to some example embodiments.

FIGS. 18 and 20 are plan views of an example of sub-pixels arranged in the second display area of FIG. 1, FIG. 19 is a cross-sectional view of an example of a cross-section of the sub-pixels taken along a line V-V' of FIG. 18, and FIG. 21 is a cross-sectional view of an example of a cross-section of the sub-pixels taken along a line VI-VI' of FIG. 20.

FIG. 18 illustrates an example of one pixel group PG including the plurality of auxiliary sub-pixels Pa arranged in the second display area DA2 (of FIG. 1). Referring to FIG. 18, the pixel group PG includes the red sub-pixel Pr, the green sub-pixel Pg, and the blue sub-pixel Pb arranged along one row in the first direction (x direction), and each of the auxiliary sub-pixels Pa may be connected to the data line DL extending in the second direction (y direction).

The data line DL may include a first data line DL1 and a second data line DL2 located at different heights. For example, as illustrated in FIG. 19, the first data line DL1 may be located on the interlayer insulating layer 115. Meanwhile, the planarization layer 117 (of FIG. 5) described above may include a first planarization layer 117a and a second planarization layer 117b, wherein the first planarization layer 117a may cover the first data line DL1. The second data line DL2 is located on the first planarization layer 117a and may be covered by the second planarization layer 117b. In this case, the pixel electrode 221 (of FIG. 5) described above may be located on the second planarization layer 117b.

As such, as the first data line DL1 and the second data line DL2 are located at different heights, a distance between the first data line DL1 and the second data line DL2 may decrease and the first data line DL1 and the second data line DL2 may be densely arranged on a plane, and thus the transmittance of the second display area DA2 (of FIG. 1) may be improved.

FIG. 20 illustrates an example of one pixel group PG including the plurality of auxiliary sub-pixels Pa arranged in the second display area DA2 of FIG. 1 in the same manner as in FIG. 18. Referring to FIG. 20, the pixel group PG includes the red sub-pixel Pr, the green sub-pixel Pg, and the blue sub-pixel Pb arranged along one row in the first direction (x direction), and each of the auxiliary sub-pixels Pa may be connected to the data line DL extending in the second direction (y direction). The data line DL may include the first data line DL1 and the second data line DL2 located at different heights. For example, as shown in FIG. 21, the first data line DL1 may be located on the first gate insulating layer 112 and the second data line DL2 may be located on the second gate insulating layer 113.

Meanwhile, a data line DLr in the red sub-pixel Pr, a data line DLg in the green sub-pixel Pg, and a data line DLb in the blue sub-pixel Pb are located on the interlayer insulating layer 115, and they may be electrically connected to the first data line DL1 and the second data line DL2 through a contact hole.

Figure 22:
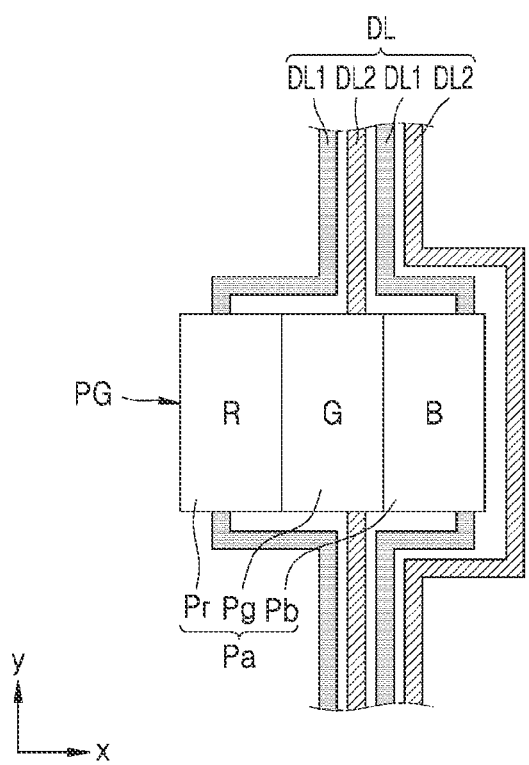
FIGS. 22 and 23 are plan views of an example of sub-pixels arranged in a second display area of FIG. 4 according to some example embodiments.
Figure 23:
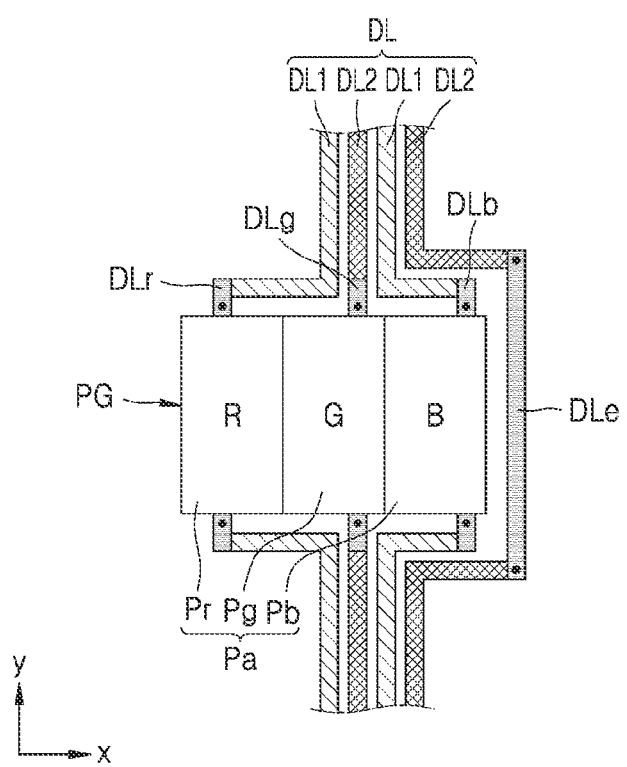

FIGS. 22 and 23 are plan views of an example of sub-pixels arranged in the second display area of FIG. 4.

Referring to FIG. 22, the pixel group PG includes the red sub-pixel Pr, the green sub-pixel Pg, and the blue sub-pixel Pb arranged along one row in the first direction (x direction), and each of the auxiliary sub-pixels Pa may be connected to the data line DL extending in the second direction (y direction).

The data line DL may include the first data line DL1 and the second data line DL2 located at different heights, and the first data line DL1 and the second data line DL2 may be located at different heights as illustrated and described in FIG. 18.

Meanwhile, in FIG. 4, because the second display area DA2 (of FIG. 4) is arranged inside the first display area DA1 (of FIG. 4), main sub-pixels are densely arranged above and below the second display area DA2 (of FIG. 4), respectively, based on the drawing. Therefore, when comparing FIG. 22 with FIG. 18, a portion of the first data line DL1 and/or the second data line DL2 may be arranged to bypass the pixel group PG to be connected to the main sub-pixels arranged above and below the second display area DA2 (of FIG. 4) based on the drawings. For example, as shown in FIG. 22, from the left, based on the drawing, the first data line DL1, the second data line DL2, and the first data line DL1 may be electrically connected to the red sub-pixel Pr, the green sub-pixel Pg, and the blue sub-pixel Pb included in one pixel group PG, respectively. The other second data line DL2 may be formed to bypass the pixel group PG.

FIG. 23 shows the data line DL arranged in the second display area DA2 (of FIG. 4) when the second display area DA2 (of FIG. 4) is located inside the first display area DA1 (of FIG. 4), in the same manner as in FIG. 22. In FIG. 23, the first data line DL1 and the second data line DL2 may be located at different heights, as in FIG. 20, and may be electrically connected to the data line DLr in the red sub-pixel Pr, the data line DLg in the green sub-pixel Pg, and the data line DLb in the blue sub-pixel Pb through a contact hole, respectively. At this time, additional second data line DL2 not connected to the pixel group PG is arranged to bypass the pixel group PG, and may be connected to a main sub-pixel arranged above and below the second display area DA2 (of FIG. 4) based on the drawing.

Meanwhile, the second data line DL2 bypassing the pixel group PG may be connected to a connection data line DLe through a contact hole. The connection data line DLe may be located on, for example, the interlayer insulating layer 115 (of FIG. 21). In this case, the connection data line DLe may be arranged so as not to overlap the first connection line CL1 (of FIG. 11), the second connection line CL2 (of FIG. 11), and the like.

Figure 24:
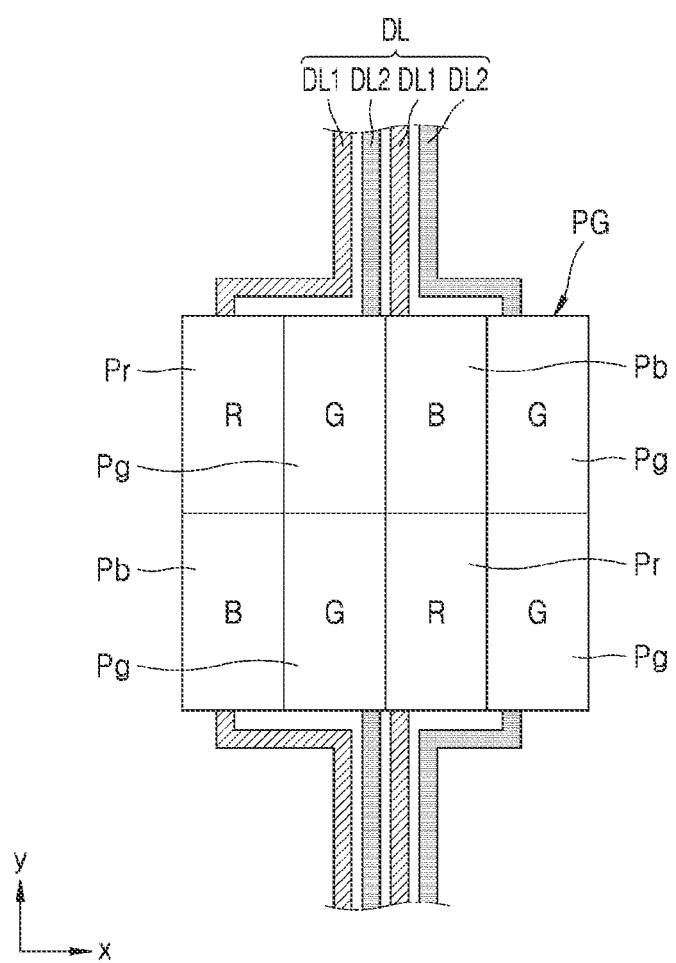
FIGS. 24 and 25 are plan views of an example of sub-pixels arranged in a second display area of FIG. 1 according to some example embodiments.
Figure 25:
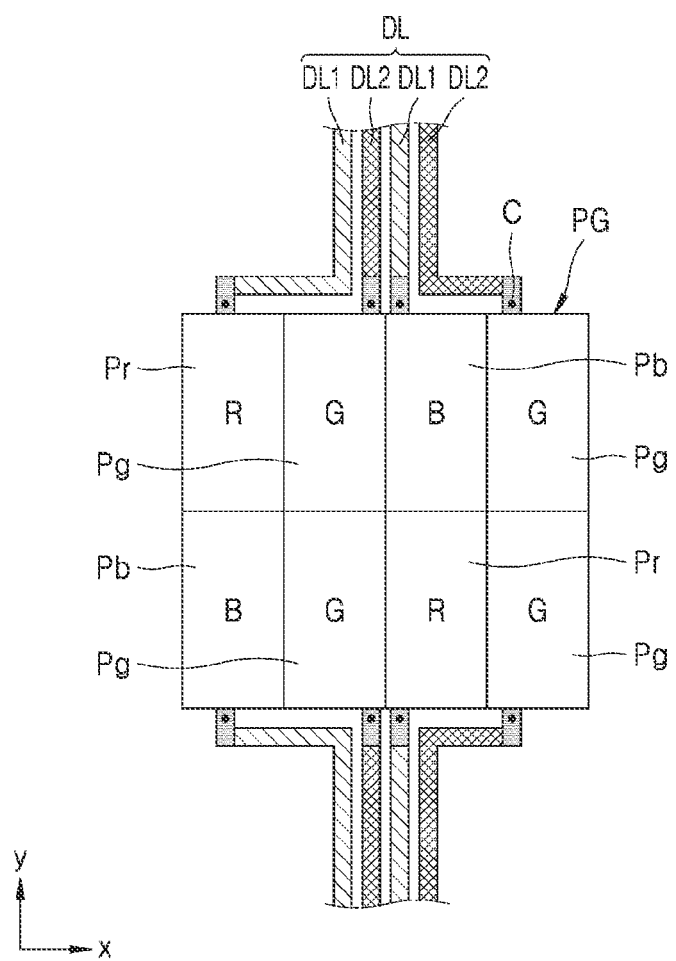
Figure 26:
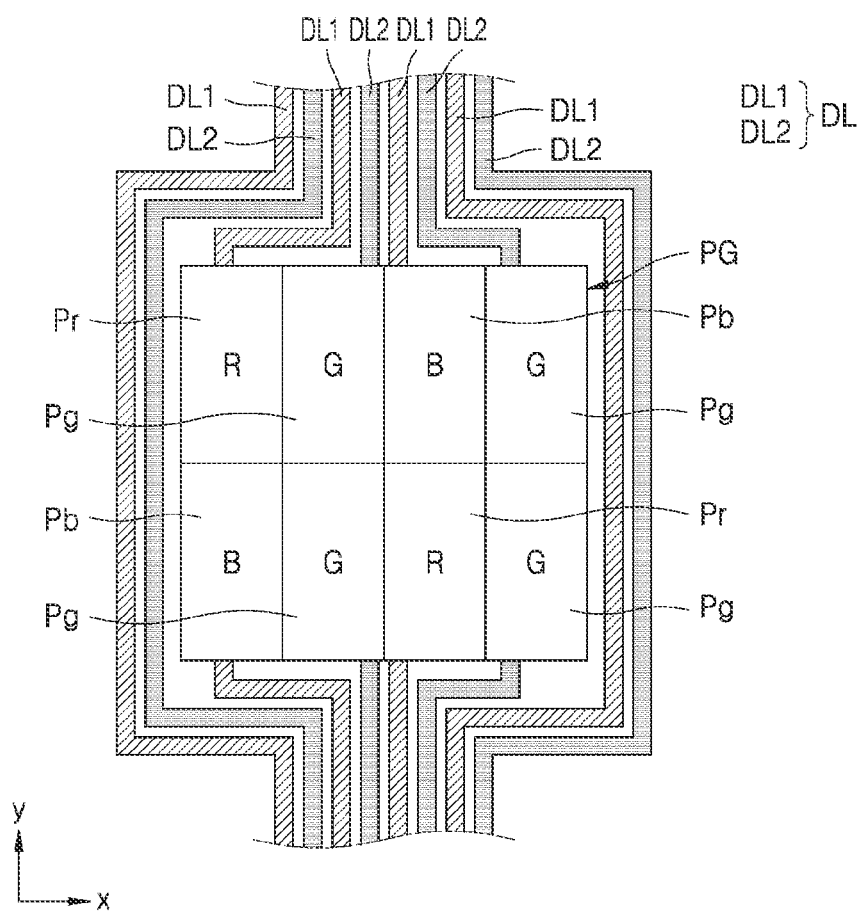
FIGS. 26 and 27 are plan views of an example of sub-pixels arranged in a second display area of FIG. 4 according to some example embodiments.
Figure 27:
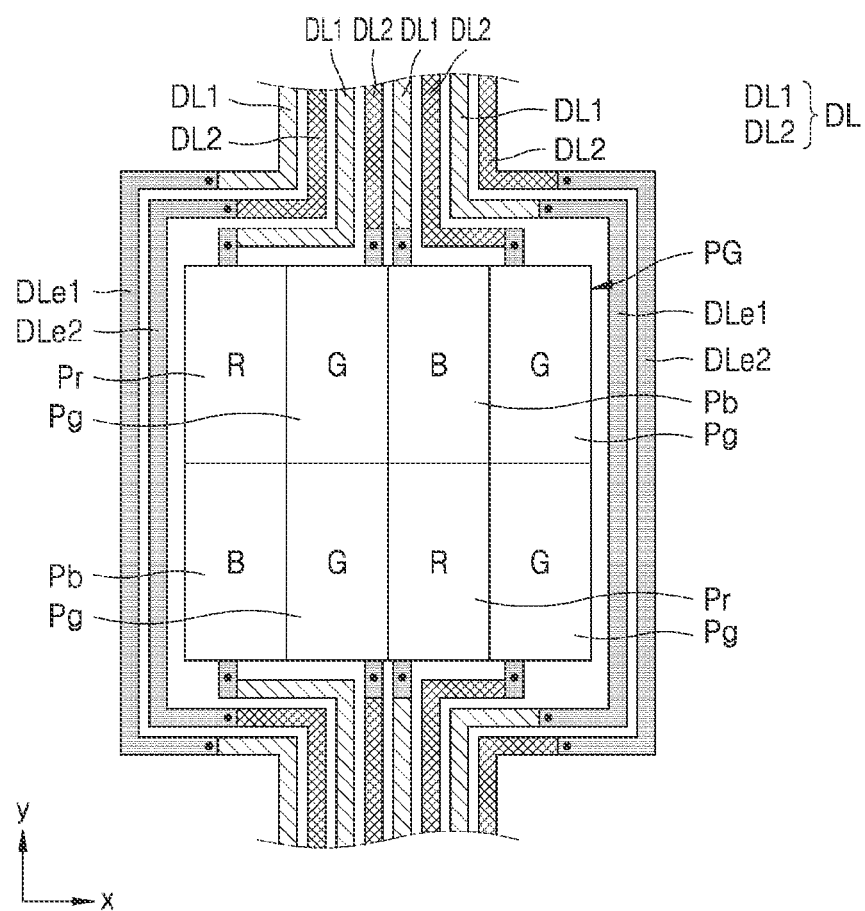

FIGS. 24 and 25 are plan views of an example of sub-pixels arranged in the second display area of FIG. 1, and FIGS. 26 and 27 are plan views of an example of sub-pixels arranged in the second display area of FIG. 4.

FIGS. 24 to 27 respectively include the red sub-pixel Pr, the green sub-pixel Pg, the blue sub-pixel Pb, and the green sub-pixel Pg arranged in the first direction (x direction), and the blue sub-pixel Pb, the green sub-pixel Pg, the red sub-pixel Pr, and the green sub-pixel Pg arranged in the first direction (x direction) in parallel with different rows as in FIG. 13, and the auxiliary sub-pixels Pa are arranged in a pentile type.

Among them, FIGS. 24 and 25 respectively show an example in which the pixel group PG is arranged in the second display area DA2 (of FIG. 1) as in FIGS. 18 and 20.

Referring to FIG. 24, data lines DL are located at different heights, and the first data line DL1, the second data line DL2, the first data line DL1, and the second data line DL2 arranged alternately with each other may extend in the second direction (y direction). Therefore, a distance between the first data line DL1 and the second data line DL2 may decrease and the first data line DL1 and the second data line DL2 may be densely arranged on a plane, and thus the transmittance of the second display area DA2 (of FIG. 1) may be improved.

In FIG. 25, the data line DL includes the first data line DL1 and the second data line DL2 located at different heights, as in FIG. 20. These data lines DL may be electrically connected to data lines inside the pixel group PG through a contact hole. For example, the data lines inside the pixel group PG may be located on the interlayer insulating layer 115 (of FIG. 21), the first data line DL1 may be located on the first gate insulating layer 112 (of FIG. 21), and the second data line DL2 may be located on the second gate insulating layer 113 (of FIG. 21).

FIGS. 26 and 27 respectively show an example in which the pixel group PG is arranged in the second display area DA2 (of FIG. 4) as in FIGS. 22 and 23. That is, main sub-pixels are densely arranged above and below the second display area DA2 (of FIG. 4), based on the drawing.

Therefore, in FIG. 26, compared to FIG. 24, the first data line DL1 and/or the second data line DL2 may be additionally arranged to bypass the pixel group PG to connect the main sub-pixels arranged above and below the second display area DA2 (of FIG. 4), based on the drawing. For example, four first data lines DL1 and second data lines DL2 among the data lines DL may be electrically connected to the pixel group PG, and the remaining four first data lines DL1 and second data lines DL2 may be arranged to bypass the pixel group PG. In this case, the first data line DL1 and the second data line DL2 are alternately arranged at different heights, as described above.

Therefore, in FIG. 27, compared to FIG. 25, the first data line DL1 and/or the second data line DL2 may be additionally arranged to bypass the pixel group PG to connect the main sub-pixels arranged above and below the second display area DA2 (of FIG. 4), based on the drawing. For example, four first data lines DL1 and second data lines DL2 among the data lines DL are electrically connected to the pixel group PG. In this case, the first data line DL1 and the second data line DL2 are alternately arranged at different heights, and may be electrically connected to data lines inside the pixel group PG through a contact hole. For example, the data lines inside the pixel group PG may be located on the interlayer insulating layer 115 (of FIG. 21), the first data line DL1 may be located on the first gate insulating layer 112 (of FIG. 21), and the second data line DL2 may be located on the second gate insulating layer 113 (of FIG. 21).

In FIG. 27, the remaining four first data lines DL1 and the second data lines DL2 bypassing the pixel group PG may be electrically connected to a first connection data line DLe1 and the second connection data line DLe2, respectively, through a contact hole. For example, the first connection data line DLe1 and the second connection data line DLe2 may be located on the interlayer insulating layer 115 (of FIG. 21), and the first connection data line DLe1 and the second connection data line DLe2 may be arranged so as not to overlap the first connection line CL1 (of FIG. 14) to the fourth connection line CL4 (of FIG. 14).

Figure 28:
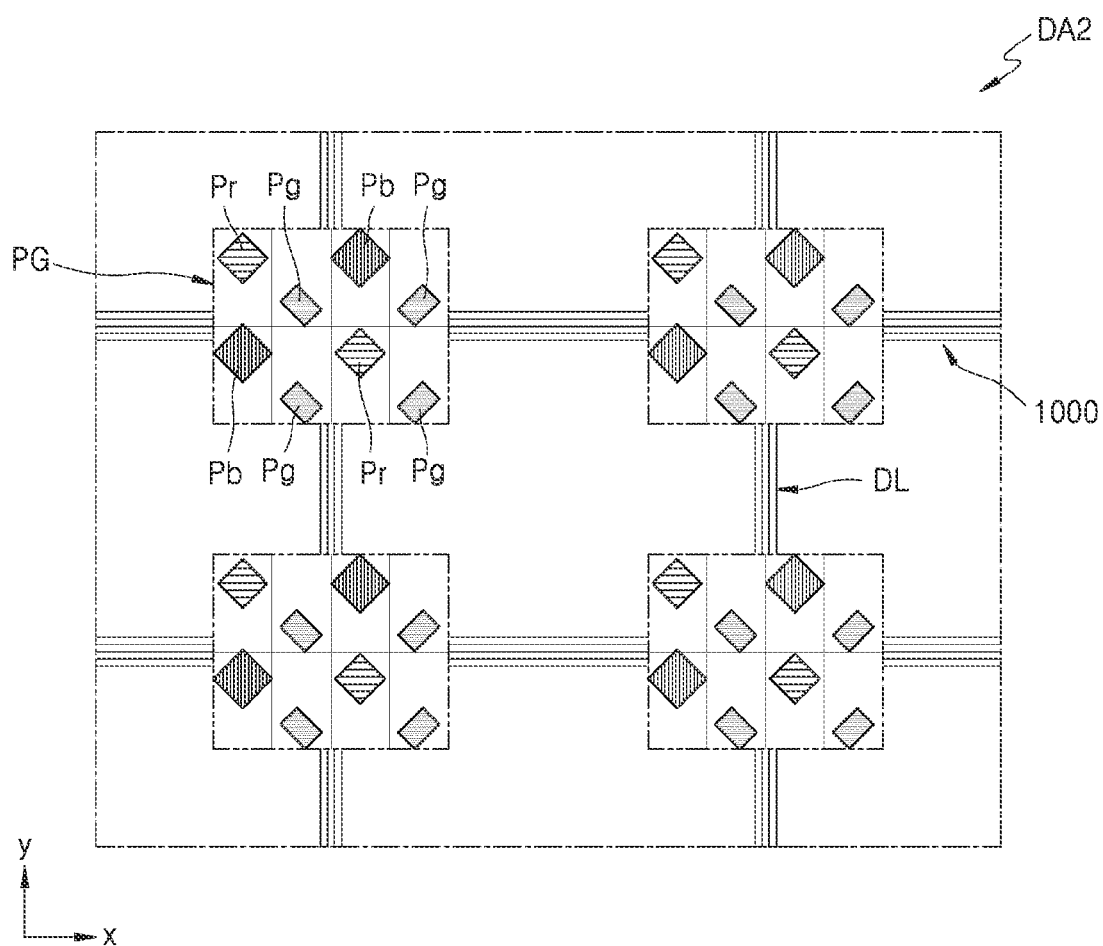
FIGS. 28-30 are plan views of an example of sub-pixels arranged in a second display area of FIG. 1 according to some example embodiments.
Figure 30:
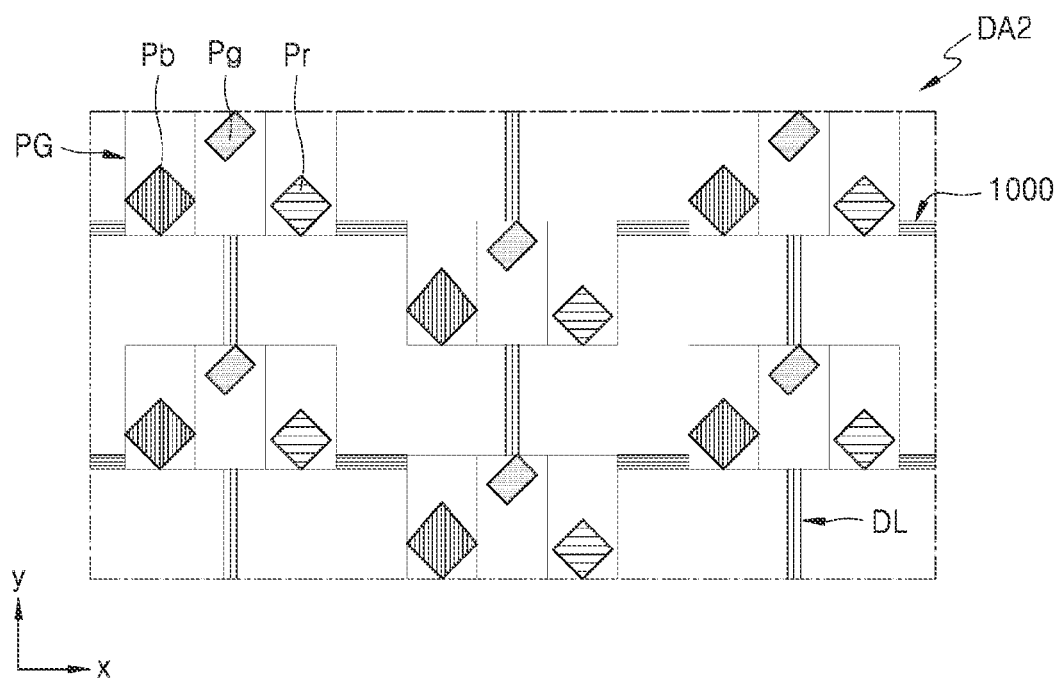

FIGS. 28 and 30 are plan views of an example of arrangement of sub-pixels arranged in the second display area of FIG. 1.

Referring to FIG. 28, the transmission portion TA may be arranged between a plurality of pixel groups Pg, and the transmission portion TA may have an integrally connected structure. Each of the plurality of pixel groups Pg may include the auxiliary sub-pixels Pa including the red sub-pixel Pr, the green sub-pixel Pg, the blue sub-pixel Pb, and the green sub-pixel Pg arranged in the first direction (x direction), and the blue sub-pixel Pb, the green sub-pixel Pg, the red sub-pixel Pr, and the green sub-pixel Pg arranged in the first direction (x direction) in parallel with different rows.

When the second display area DA2 has the pixel arrangement of FIG. 28, the resolution of the second display area DA2 may be ¼ of the first display area DA1 (of FIG. 1).

Meanwhile, the plurality of pixel groups Pg apart from each other may be electrically connected to the extension lines 1000 extending in the first direction (x direction) and the data lines DL extending in the second direction (y direction). At this time, the extension lines 1000 may be located close to each other in the middle of the pixel group PG, and the data lines DL may also be densely arranged. As a result, the transmittance of the transmission portion TA may be improved compared to a case where the extension lines 1000 and the data lines DL are widely distributed in the transmission portion TA, and interference by the extension lines 1000 and the data lines DL may be reduced when the component 20 (of FIG. 5) transmits and receives a signal.

Figure 29:
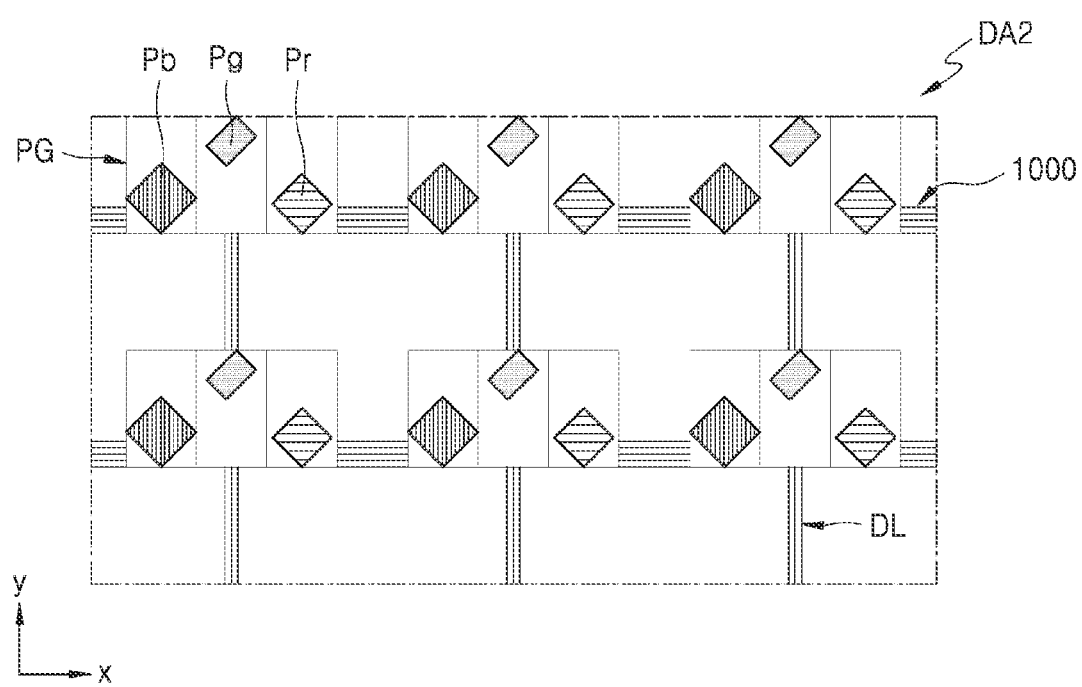

Each of FIGS. 29 and 30 shows an example in which one pixel group PG includes the red sub-pixel Pr, the green sub-pixel Pg, and the blue sub-pixel Pb, and these pixel groups PG are electrically connected to each other by the extension lines 1000 extending in the first direction (x direction) and the data lines DL extending in the second direction (y direction). In this case, the transmission lines 1000 and the data lines DL are densely arranged, and thus the transmittance of the second display area DA2 may be improved. Meanwhile, FIG. 29 shows an example in which the pixel groups PG are apart in the first direction (x direction) and the second direction (y direction), and form a grid pattern, and FIG. 30 shows an example in which the pixel groups PG are apart from each other in the first direction (x direction) and the second direction (y direction), and have a zigzag pattern in the first direction (x direction). However, when the pixel arrangements of FIGS. 29 and 30 are provided, the resolution of the second display area DA2 may be ⅜ of the first display area DA1 (of FIG. 1).

In addition, pixels may be arranged in the second display area DA2 in various ways.

According to embodiments of the disclosure, a display area is expanded by displaying an image even in an area where an electronic element is arranged, and the number of extension lines arranged in a transmission portion of a second display area in which the electronic element is arranged decreases, thereby improving transmittance of the transmission portion.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:
1. A display device comprising:
a first display area comprising main sub-pixels;
a second display area comprising pixel groups spaced apart from each other and a transmission portion configured to transmit light therethrough between the pixel groups, wherein each of the pixel groups comprises a plurality of auxiliary sub-pixels;
first lines arranged between two pixel groups adjacent to each other from among the pixel groups;
first data lines electrically connected to each of the plurality of auxiliary sub-pixels;
second data lines bypassing the pixel groups and electrically connected to each of the main sub-pixels; and
second lines arranged in a direction crossing the first and second data lines and electrically connected to the plurality of auxiliary sub-pixels,
wherein the first lines are electrically connected to the second lines included in each of the two pixel groups, and a number of the first lines is less than a number of the second lines, and
wherein at least one of the first data lines is located on a same layer as the second data lines.

2. The display device of claim 1, wherein two adjacent first lines from among the first lines are located on different layers.

3. The display device of claim 1, wherein the pixel groups are arranged in a zigzag pattern, and
wherein each of the pixel groups comprises a red sub-pixel, a green sub-pixel, and a blue sub-pixel.

4. The display device of claim 1, wherein each of the plurality of auxiliary sub-pixels comprises a pixel circuit and a display element electrically connected to the pixel circuit,
the pixel circuit comprises a driving thin-film transistor configured to supply a driving current to the display element, a first initialization thin-film transistor configured to initialize a voltage of a driving gate electrode of the driving thin-film transistor, and a second initialization thin-film transistor configured to initialize a pixel electrode of the display element,
the second lines comprise a first initialization voltage line configured to transmit an initialization voltage to the first initialization thin-film transistor and a second initialization voltage line configured to transmit the initialization voltage to the second initialization thin-film transistor, and
the first initialization voltage line and the second initialization voltage line are electrically connected to each other by a first connection line.

5. The display device of claim 4, wherein the pixel circuit further comprises a switching thin-film transistor configured to transmit a data signal to a driving source electrode of the driving thin-film transistor,
the second lines further comprise a first scan line configured to transmit a previous scan signal to the first initialization thin-film transistor, a second scan line electrically connected to a switching gate electrode of the switching thin-film transistor, and a third scan line electrically connected to a second initialization gate electrode of the second initialization thin-film transistor, and
the second scan line and the third scan line are electrically connected to each other by a second connection line, and a same scan signal is applied thereto.

6. The display device of claim 5, wherein at least one of the first connection line or the second connection line is located on a different layer from that of the second lines.

7. The display device of claim 1, wherein each of the plurality of auxiliary sub-pixels comprises a pixel circuit and a display element electrically connected to the pixel circuit, and each of the first data lines is electrically connected to the pixel circuit of the each of the plurality of auxiliary sub-pixels, respectively.

8. The display device of claim 1, wherein each of the plurality of auxiliary sub-pixels comprises a pixel circuit and a display element electrically connected to the pixel circuit, and each of the second data lines does not overlap the each of the plurality of auxiliary sub-pixels.

9. The display device of claim 1, wherein each of the pixel groups is surrounded by the transmission portion.

10. The display device of claim 1, wherein the second display area is surrounded by the first display area.

11. A display device comprising:
a display panel having a first display area and a second display area having different resolutions from each other; and
an electronic element corresponding to the second display area of the display panel,
wherein the display panel comprises:
a substrate;
a plurality of main sub-pixels on the substrate in the first display area;
a plurality of pixel groups on the substrate and spaced apart from each other in the second display area, with a transmission portion configured to transmit light therethrough between the pixel groups, wherein each of the pixel groups comprises a plurality of auxiliary sub-pixels;
first lines arranged between two pixel groups adjacent to each other from among the plurality of pixel groups;
first data lines electrically connected to each of the plurality of auxiliary sub-pixels;
second data lines bypassing the pixel groups and electrically connected to each of the plurality of main sub-pixels; and
second lines arranged in a direction crossing the first and second data lines and electrically connected to the plurality of auxiliary sub-pixels,
wherein the first lines are electrically connected to the second lines included in each of the two pixel groups, and
wherein at least one of the first data lines is located on a same layer as the second data lines.

12. The display device of claim 11, wherein two adjacent first lines from among the first lines are located on different layers.

13. The display device of claim 11, wherein each of the plurality of auxiliary sub-pixels comprises a pixel circuit and a display element electrically connected to the pixel circuit,
the pixel circuit comprises a driving thin-film transistor configured to supply a driving current to the display element, a first initialization thin-film transistor configured to initialize a voltage of a driving gate electrode of the driving thin-film transistor, and a second initialization thin-film transistor configured to initialize a pixel electrode of the display element, and
the second lines comprise a first initialization voltage line configured to transmit an initialization voltage to the first initialization thin-film transistor and a second initialization voltage line configured to transmit the initialization voltage to the second initialization thin-film transistor,
wherein the first initialization voltage line and the second initialization voltage line are electrically connected to each other by a first connection line.

14. The display device of claim 13, wherein the pixel circuit further comprises a switching thin-film transistor configured to transmit a data signal to a driving source electrode of the driving thin-film transistor,
the second lines further comprise a first scan line configured to transmit a previous scan signal to the first initialization thin-film transistor, a second scan line electrically connected to a switching gate electrode of the switching thin-film transistor, and a third scan line electrically connected to a second initialization gate electrode of the second initialization thin-film transistor, and
the second scan line and the third scan line are electrically connected to each other by a second connection line, and a same scan signal is applied thereto.

15. The display device of claim 11, wherein, on a plane, a width of an area in which the first lines are arranged in the direction crossing the first lines is less than a width of an area in which the second lines are arranged in the direction crossing the first lines.

16. The display device of claim 11, wherein the pixel groups are arranged in a zigzag pattern, and
wherein each of the pixel groups comprises a red sub-pixel, a green sub-pixel, and a blue sub-pixel.

17. The display device of claim 11, wherein the first data lines electrically connected to one of the plurality of pixel groups extend to an adjacent one of the plurality of pixel groups through the transmission portion between the pixel groups.

18. The display device of claim 11, wherein each of the plurality of auxiliary sub-pixels comprises a pixel circuit and a display element electrically connected to the pixel circuit, and
each of the second data lines does not overlap the each of the plurality of auxiliary sub-pixels.

19. The display device of claim 11, wherein a number of the first lines is less than a number of the second lines.

20. The display device of claim 11, wherein the electronic element comprises an imaging device.

* * * * *